United States Patent
Kato

(10) Patent No.: US 11,908,511 B2
(45) Date of Patent: Feb. 20, 2024

(54) SEMICONDUCTOR MEMORY DEVICE

(71) Applicant: KIOXIA CORPORATION, Tokyo (JP)

(72) Inventor: Koji Kato, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 124 days.

(21) Appl. No.: 17/645,814

(22) Filed: Dec. 23, 2021

(65) Prior Publication Data

US 2022/0366966 A1 Nov. 17, 2022

(30) Foreign Application Priority Data

May 12, 2021 (JP) .................... 2021-080885

(51) Int. Cl.
| | | |
|---|---|---|
| *G11C 16/08* | (2006.01) | |
| *G11C 11/4096* | (2006.01) | |
| *G11C 11/4074* | (2006.01) | |
| *G11C 5/06* | (2006.01) | |
| *G11C 11/4076* | (2006.01) | |
| *G11C 11/408* | (2006.01) | |

(52) U.S. Cl.
CPC .......... *G11C 11/4096* (2013.01); *G11C 5/063* (2013.01); *G11C 11/408* (2013.01); *G11C 11/4074* (2013.01); *G11C 11/4076* (2013.01)

(58) Field of Classification Search
CPC ................. G11C 11/4098; G11C 5/063; G11C 11/4074; G11C 11/4076; G11C 11/408
See application file for complete search history.

(56) References Cited

U.S. PATENT DOCUMENTS

| | | | | |
|---|---|---|---|---|
| 6,052,321 | A * | 4/2000 | Roohparvar | G11C 7/14 365/201 |
| 9,666,296 | B1 | 5/2017 | Maejima | |
| 11,139,030 | B1 * | 10/2021 | Prakash | G11C 16/3422 |
| 2009/0052257 | A1 * | 2/2009 | Park | G11C 16/26 365/185.23 |
| 2019/0074059 | A1 * | 3/2019 | Lin | G11C 13/0064 |
| 2021/0090657 | A1 * | 3/2021 | Ahn | G11C 16/32 |

FOREIGN PATENT DOCUMENTS

JP 2017-157260 A 9/2017

* cited by examiner

*Primary Examiner* — Min Huang
(74) *Attorney, Agent, or Firm* — Oblon, McClelland, Maier & Neustadt, L.L.P.

(57) ABSTRACT

A semiconductor memory device includes a memory string, first wirings electrically connected to the memory string, second wirings electrically connected to the first wirings, transistors electrically connected between the first wirings and the second wirings, and a third wiring connected to gate electrodes of the transistors in common. The memory string includes memory transistors connected in series. Gate electrodes of the memory transistors are connected to the first wirings. The semiconductor memory device executes a first read operation in response to an input of a first command set, and executes a second read operation in response to an input of a second command set. A first voltage that turns the transistors ON is applied to the third wiring from an end of the first read operation to a start of the second read operation.

20 Claims, 22 Drawing Sheets

| 1-3-3 code | Er | A | B | C | D | E | F | G |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

| 1-2-4 code | Er | A | B | C | D | E | F | G |
|---|---|---|---|---|---|---|---|---|
| Upper | 1 | 0 | 0 | 1 | 1 | 0 | 0 | 1 |
| Middle | 1 | 1 | 0 | 0 | 0 | 0 | 1 | 1 |
| Lower | 1 | 1 | 1 | 1 | 0 | 0 | 0 | 0 |

SEMICONDUCTOR MEMORY DEVICE

CROSS-REFERENCE TO RELATED APPLICATIONS

This application is based upon and claims the benefit of Japanese Patent Application No. 2021-080885, filed on May 12, 2021, the entire contents of which are incorporated herein by reference.

BACKGROUND

Field

Embodiments described herein relate generally to a semiconductor memory device.

Description of the Related Art

There has been known a semiconductor memory device that includes a memory string and a plurality of first wirings electrically connected to the memory string. The memory string includes a plurality of memory transistors connected in series, and gate electrodes of these plurality of memory transistors are connected to the plurality of first wirings.

DETAILED DESCRIPTION

Figure 1:
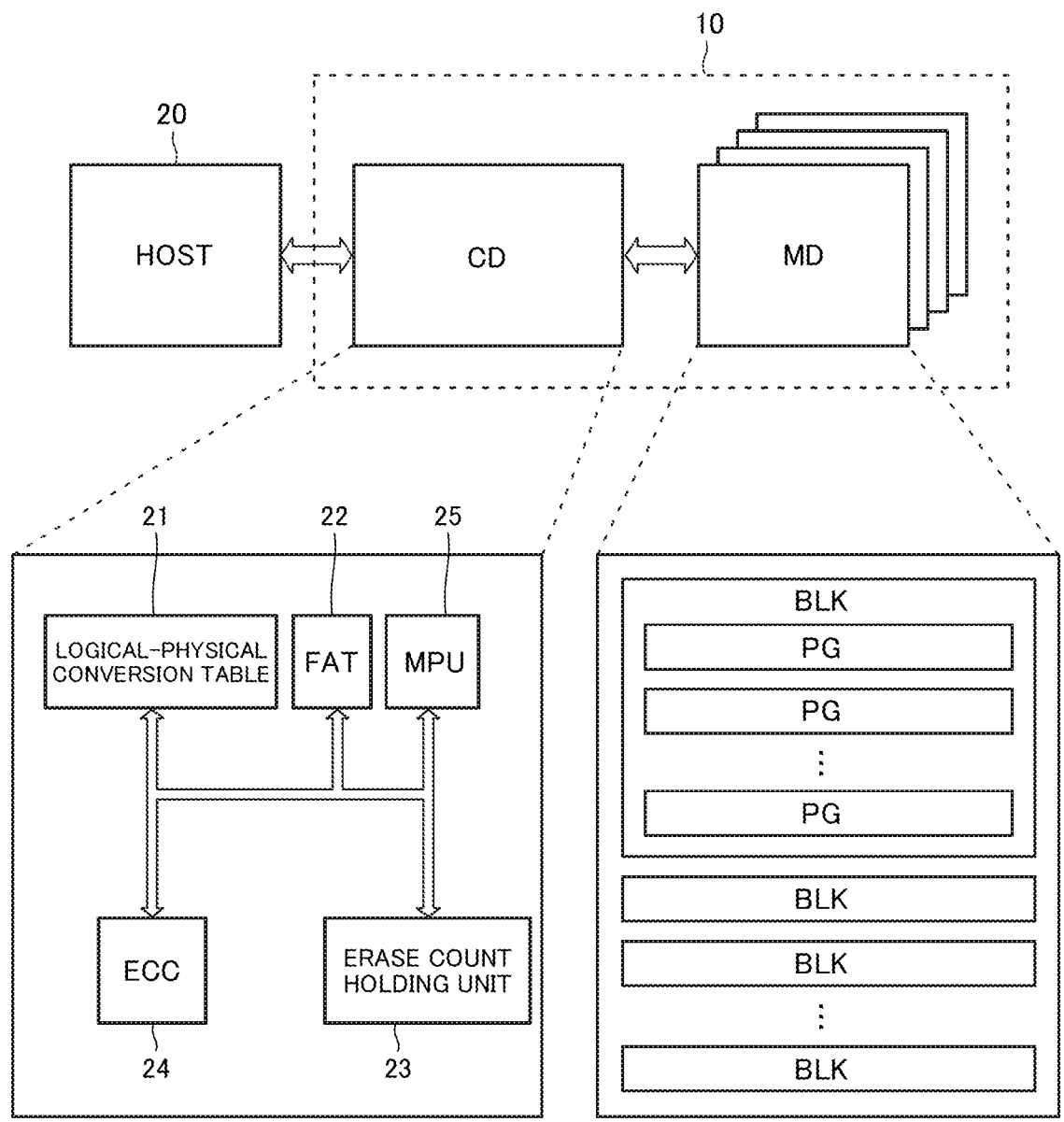
FIG. 1 is a schematic block diagram illustrating a configuration of a memory system 10 according to a first embodiment.

A semiconductor memory device according to one embodiment comprises a memory string, a plurality of first wirings electrically connected to the memory string, a plurality of second wirings electrically connected to the plurality of first wirings, a plurality of transistors electrically connected between the plurality of first wirings and the plurality of second wirings, and a third wiring connected to gate electrodes of the plurality of transistors in common. The memory string includes a plurality of memory transistors connected in series. Gate electrodes of the plurality of memory transistors are connected to the plurality of first wirings. The semiconductor memory device executes a first read operation in response to an input of a first command set, and executes a second read operation in response to an input of a second command set. A first voltage that turns the plurality of transistors ON is applied to the third wiring from an end of the first read operation to a start of the second read operation.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of a memory system 10 according to the first embodiment.

The memory system 10, for example, reads, writes, and erases user data in response to a signal transmitted from a host computer 20. The memory system 10 is, for example, any system that can store the user data including a memory chip, a memory card, and an SSD. The memory system 10 includes a plurality of memory dies MD and a controller die CD.

The memory die MD stores the user data. The memory die MD includes a plurality of memory blocks BLK. The memory block BLK includes a plurality of pages PG. The memory block BLK may be an execution unit of an erase operation. The page PG may be an execution unit of a read operation and a write operation.

As illustrated in FIG. 1, the controller die CD is connected to the plurality of memory dies MD and the host computer 20. The controller die CD includes, for example, a logical-physical conversion table 21, a File Allocation Table (FAT) 22, an erase count holding unit 23, an ECC circuit 24, and a Micro Processor Unit (MPU) 25.

The logical-physical conversion table 21 correlates a logical address received from the host computer 20 with a physical address assigned to the page PG of the memory die MD, and holds them. The logical-physical conversion table 21 is achieved by, for example, a Random Access Memory (RAM) (not illustrated).

The FAT 22 holds FAT information indicating states of the respective pages PG. Such FAT information includes, for example, information indicative of "valid", "invalid", and "erased". For example, a "valid" page PG stores valid data that is read out corresponding to an instruction from the host computer 20. An "invalid" page PG stores invalid data that is not read out corresponding to an instruction from the host computer 20. An "erased" page PG stores no data after the execution of the erase operation. The FAT 22 is achieved by, for example, a RAM (not illustrated).

The erase count holding unit 23 correlates the physical address corresponding to the memory block BLK with a count of the erase operation executed to the memory block BLK, and holds them. The erase count holding unit 23 is achieved by, for example, a RAM (not illustrated).

The ECC circuit 24 detects an error in data read out from the memory die MD, and corrects the data when it is possible.

The MPU 25 refers to the logical-physical conversion table 21, the FAT 22, the erase count holding unit 23, and the ECC circuit 24, and performs processes, such as a conversion between the logical address and the physical address, a bit error detection/correction, a garbage collection (compaction), and a wear leveling.

Figure 2:
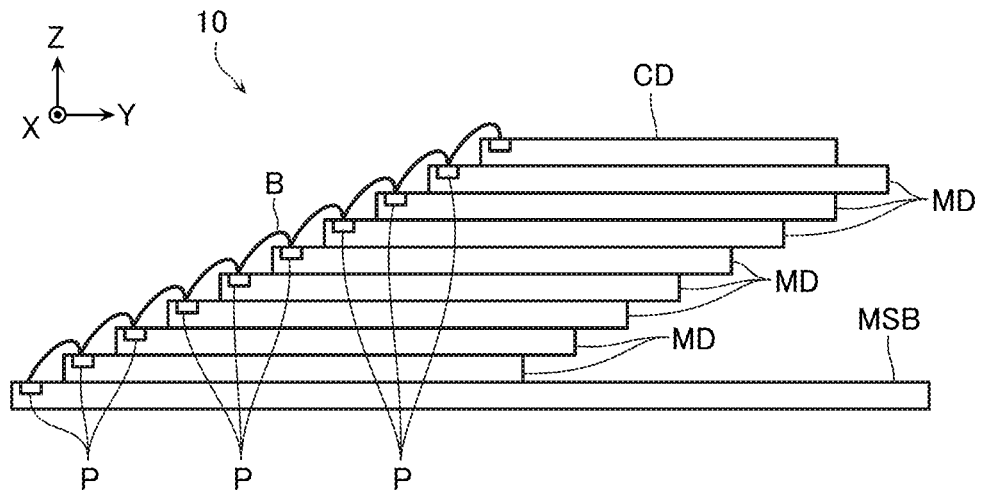
FIG. 2 is a schematic side view illustrating an exemplary configuration of the memory system 10.
Figure 3:
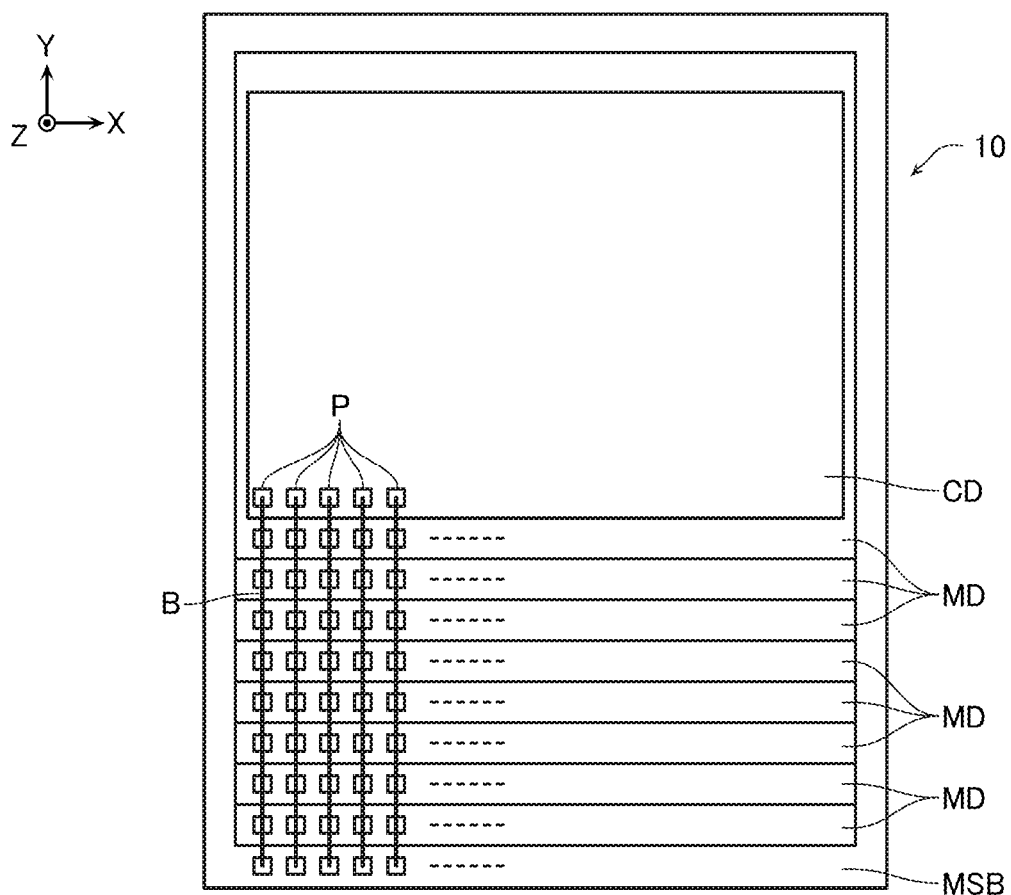
FIG. 3 is a schematic plan view illustrating the exemplary configuration of the memory system 10.

FIG. 2 is a schematic side view illustrating an exemplary configuration of the memory system 10 according to the embodiment. FIG. 3 is a schematic plan view illustrating the exemplary configuration. For convenience of description, FIG. 2 and FIG. 3 omit a part of the configuration.

As illustrated in FIG. 2, the memory system 10 according to the embodiment includes a mounting substrate MSB, the plurality of memory dies MD, and the controller die CD. On an upper surface of the mounting substrate MSB, a pad electrode P is disposed in a region at an end portion in the Y-direction. A region excluding the end portion in the Y-direction in the upper surface of the mounting substrate MSB is bonded to a lower surface of the memory die MD via an adhesive and the like. A plurality of the memory dies MD are stacked on the mounting substrate MSB. On an upper surface of the memory die MD, the pad electrode P is disposed in a region at an end portion in the Y-direction. A region excluding the end portion in the Y-direction in the upper surface of the memory die MD is bonded to a lower surface of another memory die MD or the controller die CD via the adhesive and the like. The controller die CD is stacked on the memory die MD. On an upper surface of the controller die CD, the pad electrode P is disposed in a region at an end portion in the Y-direction.

As illustrated in FIG. 3, the mounting substrate MSB, the plurality of memory dies MD, and the controller die CD each include a plurality of the pad electrodes P arranged in the X-direction. The plurality of pad electrodes P disposed to each of the mounting substrate MSB, the plurality of memory dies MD, and the controller die CD are mutually connected via bonding wires B.

Note that the configuration illustrated in FIG. 2 and FIG. 3 is merely an example, and specific configurations are appropriately adjustable. For example, in the example illustrated in FIG. 2 and FIG. 3, the controller die CD is stacked on the plurality of memory dies MD. The memory die MD and the controller die CD are connected by the bonding wires B. The plurality of memory dies MD and the controller die CD are included in one package. However, the controller die CD may be included in a package different from the memory die MD. Additionally, the plurality of memory dies MD and the controller die CD may be connected to one another via through electrodes or the like, not the bonding wires B.

[Circuit Configuration of Memory Die MD]

Figure 4:
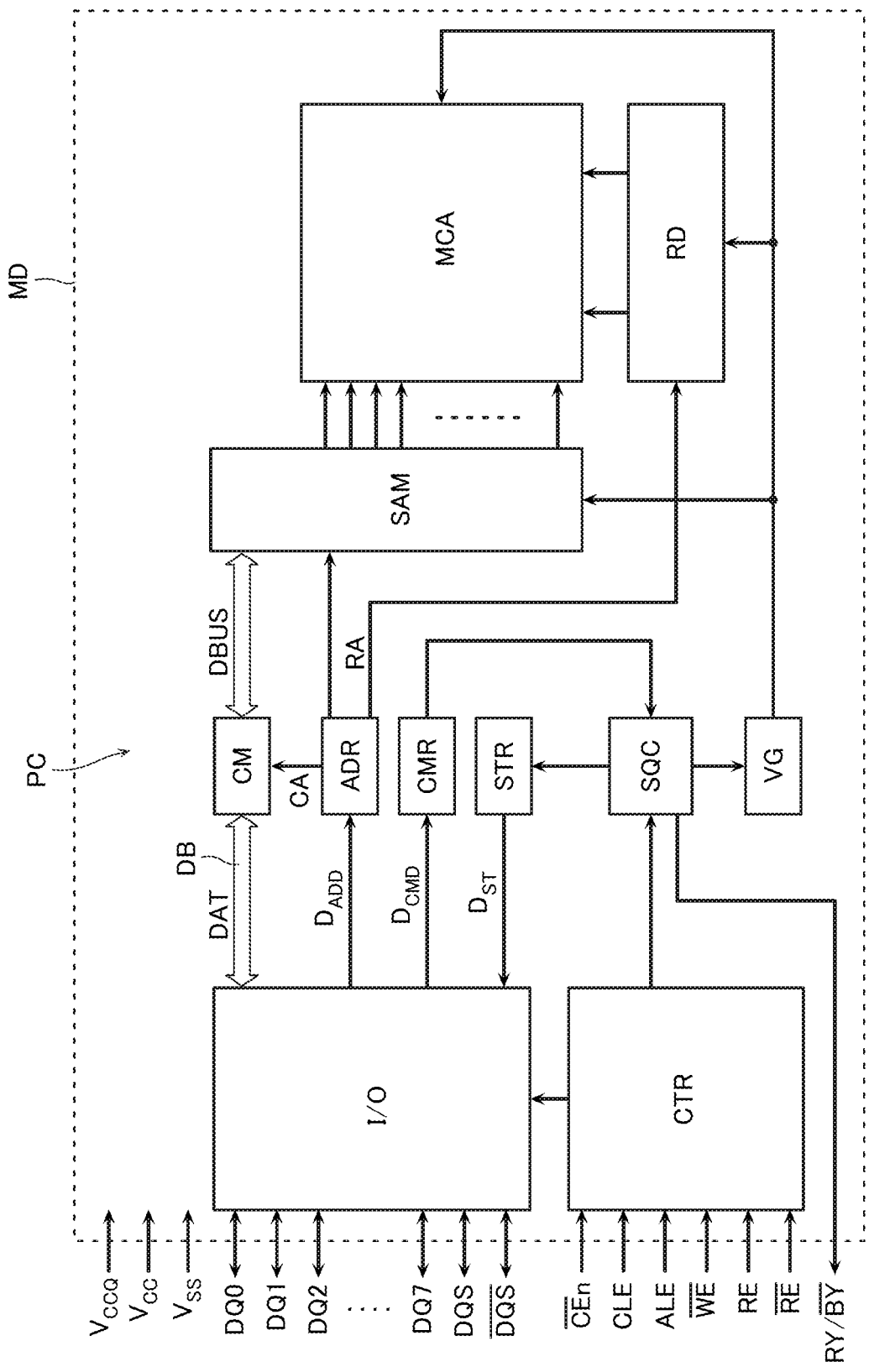
FIG. 4 is a schematic block diagram illustrating a configuration of a memory die MD according to the first embodiment.

FIG. 4 is a schematic block diagram illustrating the configuration of the memory die MD according to the first embodiment. FIG. 5 to FIG. 11 are schematic circuit diagrams illustrating a part of the configuration of the memory die MD.

FIG. 4 illustrates a plurality of control terminals and the like. These plurality of control terminals are indicated as control terminals corresponding to a high active signal (positive logic signal) in some cases. These plurality of control terminals are indicated as control terminals corresponding to a low active signal (negative logic signal) in some cases. These plurality of control terminals are indicated as control terminals corresponding to both the high active signal and the low active signal in some cases. In FIG. 4, a reference sign of the control terminal corresponding to the low active signal includes an over line (overbar). In this specification, a reference sign of the control terminal corresponding to the low active signal includes a slash ("/"). The description of FIG. 4 is an example, and specific aspects are appropriately adjustable. For example, a part of or all of the high active signals can be changed to the low active signals, or a part of or all of the low active signals can be changed to the high active signals.

As illustrated in FIG. 4, the memory die MD includes a memory cell array MCA and a peripheral circuit PC. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Circuit Configuration of Memory Cell Array MCA]

Figure 5:
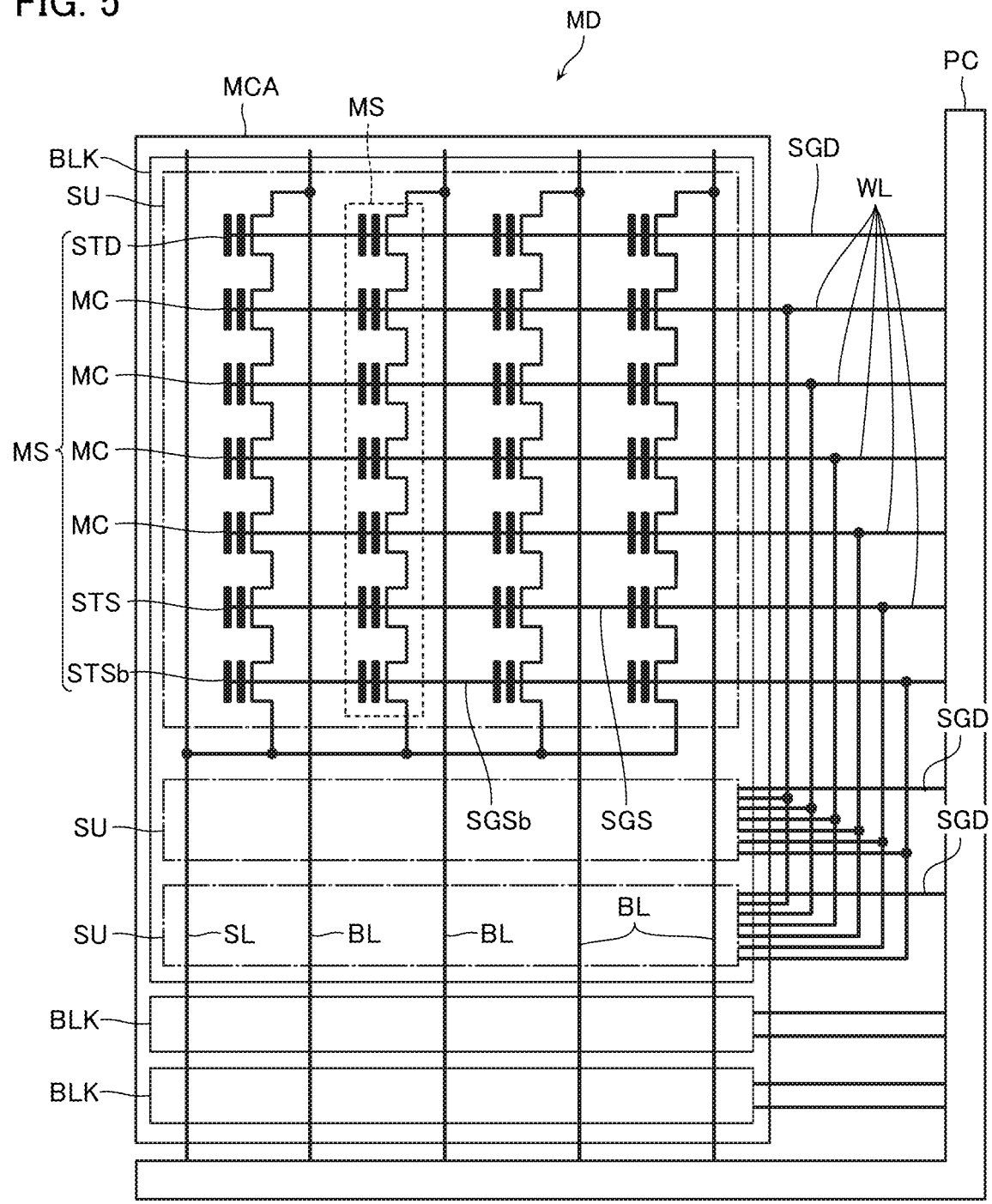
FIG. 5 is a schematic circuit diagram illustrating a part of the configuration of the memory die MD.

As illustrated in FIG. 5, the memory cell array MCA includes the above-described plurality of memory blocks BLK. Each of these plurality of memory blocks BLK includes a plurality of string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL.

The memory string MS includes a drain-side select transistor STD, a plurality of memory cells MC (memory transistors), a source-side select transistor STS, and a source-side select transistor STSb. The drain-side select transistor STD, the plurality of memory cells MC, the source-side select transistor STS, and the source-side select transistor STSb are connected in series between the bit line BL and the source line SL. Hereinafter, the drain-side select transistor STD, the source-side select transistor STS, and the source-side select transistor STSb are simply referred to as select transistors (STD, STS, STSb) in some cases.

The memory cell MC is a field-effect type transistor. The memory cell MC includes a semiconductor layer, a gate insulating film, and a gate electrode. The semiconductor layer functions as a channel region. The gate insulating film includes an electric charge accumulating film. The memory cell MC has a threshold voltage that varies corresponding to an electric charge amount in the electric charge accumulating film. The memory cell MC stores data of one bit or a plurality of bits. The gate electrodes of the plurality of memory cells MC corresponding to one memory string MS are connected to respective word lines WL. Each of these word lines WL is connected to all the memory strings MS in one memory block BLK in common.

The select transistors (STD, STS, STSb) are field-effect type transistors. The select transistors (STD, STS, STSb) each include a semiconductor layer, a gate insulating film, and a gate electrode. The semiconductor layer functions as a channel region. The gate electrodes of the select transistors (STD, STS, STSb) are connected to the select gate lines (SGD, SGS, SGSb), respectively. One drain-side select gate line SGD is commonly connected to all the memory strings MS in one string unit SU. One source-side select gate line SGS is commonly connected to all the memory strings MS in one memory block BLK. One source-side select gate line SGSb is commonly connected to all the memory strings MS in one memory block BLK.

[Circuit Configuration of Voltage Generation Circuit VG]

Figure 6:
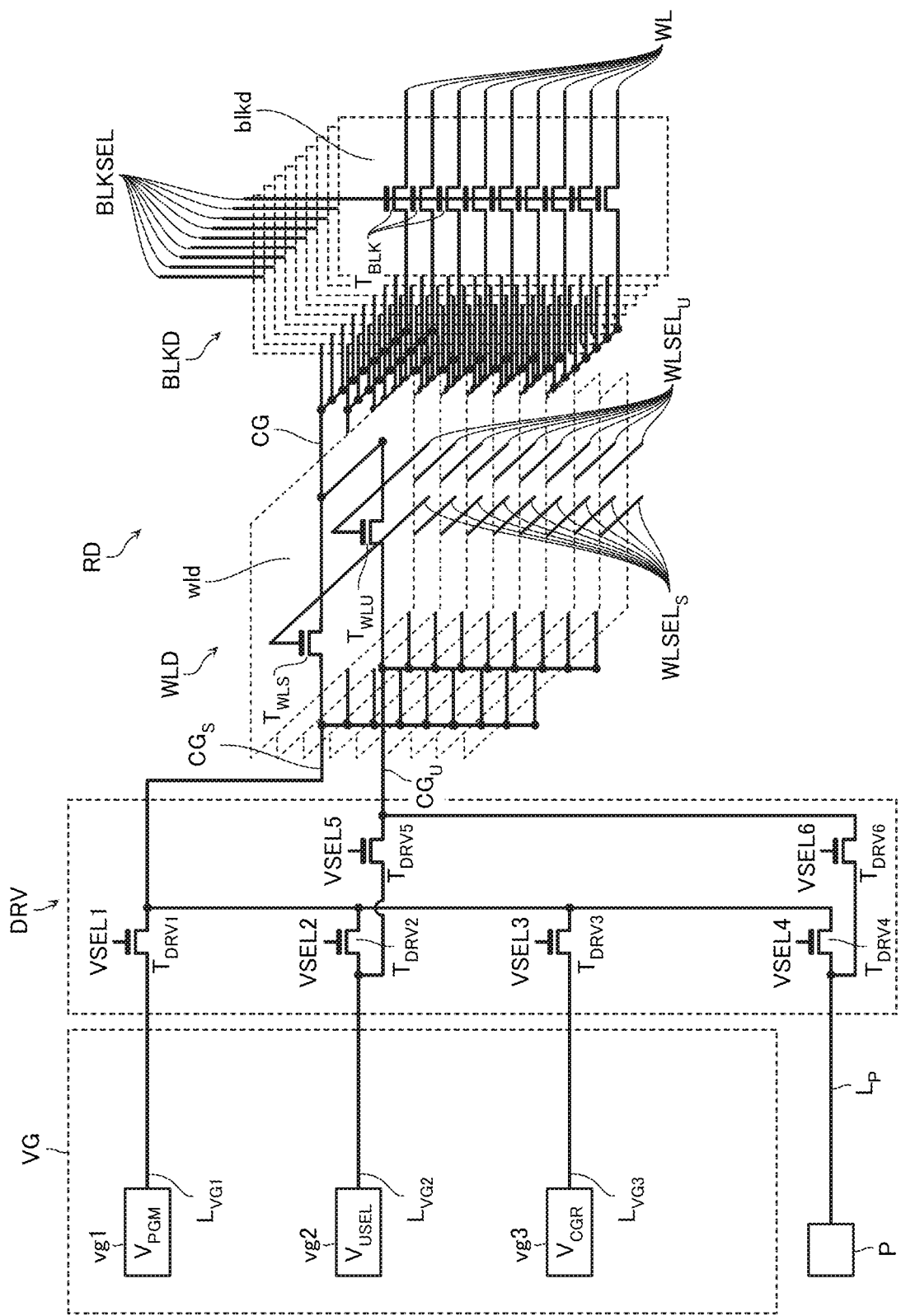
FIG. 6 is a schematic circuit diagram illustrating a part of the configuration of the memory die MD.

For example, as illustrated in FIG. 6, the voltage generation circuit VG (FIG. 4) includes a plurality of voltage generation units vg1 to vg3. The voltage generation units vg1 to vg3 generate voltages of predetermined magnitudes and output them via voltage supply lines $L_{VG}$ in the read operation, the write operation, and the erase operation. For example, the voltage generation unit vg1 outputs a program voltage used in the write operation. The voltage generation unit vg2 outputs a read pass voltage $V_{READ}$, a standby voltage $V_{READ\_WAIT}$, and the like described later in the read operation. The voltage generation unit vg2 outputs a write pass voltage used in the write operation. The voltage generation unit vg3 outputs a read voltage described later in the read operation. The voltage generation unit vg3 outputs a verify voltage described later in the write operation. For example, the voltage generation units vg1 to vg3 may be a step-up circuit such as a charge pump circuit, or may be a step-down circuit such as a regulator. These step-down circuit and step-up circuit are each connected to a voltage supply line $L_P$. The voltage supply line $L_P$ is applied with a power supply voltage $V_{CC}$ or a ground voltage $V_{SS}$ (FIG. 4). These voltage supply lines $L_P$ are, for example, connected to the pad electrodes P described with reference to FIG. 2 and FIG. 3. The operating voltage output from the voltage generation circuit VG is adjusted as necessary in accordance with a control signal from the sequencer SQC.

A charge pump circuit 32 (FIG. 7) in the voltage generation circuit VG includes a voltage output circuit 32a, a voltage dividing circuit 32b, and a comparator 32c. The voltage output circuit 32a outputs a voltage $V_{OUT}$ to the voltage supply line $L_{VG}$. The voltage dividing circuit 32b is connected to the voltage supply line $L_{VG}$. The comparator 32c outputs a feedback signal FB to the voltage output circuit 32a corresponding to a magnitude relation between a voltage $V_{OUT}'$ output from the voltage dividing circuit 32b and a reference voltage $V_{REF}$.

Figure 8:
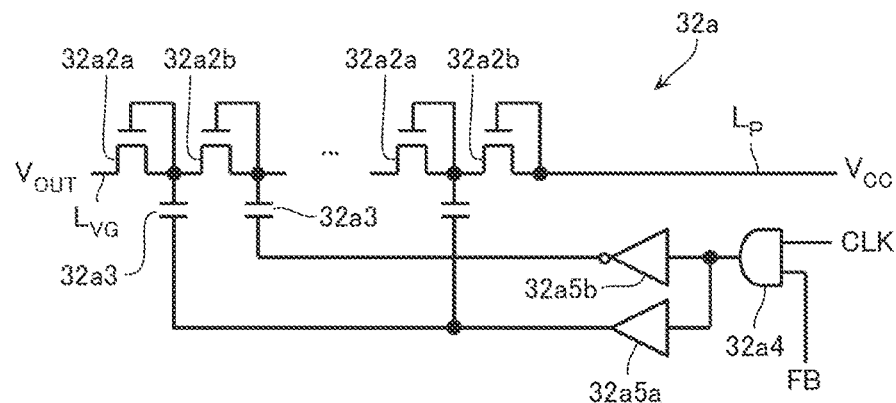
FIG. 8 is a schematic circuit diagram illustrating a part of the configuration of the memory die MD.

As illustrated in FIG. 8, the voltage output circuit 32a includes a plurality of transistors 32a2a, 32a2b. The plurality of transistors $32a2a$, $32a2b$ are alternately connected between the voltage supply line $L_{VG}$ and the voltage supply line $L_P$. The illustrated voltage supply line $L_P$ is applied with the power supply voltage $V_{CC}$. Gate electrodes of the plurality of transistors $32a2a$, $32a2b$ connected in series are connected to their own drain electrodes and respective capacitors $32a3$. The voltage output circuit $32a$ includes an AND circuit $32a4$, a level shifter $32a5a$, and a level shifter $32a5b$. The AND circuit $32a4$ outputs a logical disjunction of the clock signal CLK and the feedback signal FB. The level shifter $32a5a$ steps up the output signal of the AND circuit $32a4$ and outputs it. The level shifter $32a5a$ includes an output terminal connected to the gate electrode of the transistor $32a2a$ via the capacitor $32a3$. The level shifter $32a5b$ steps up an inverted signal of the output signal of the AND circuit $32a4$ and outputs it. The level shifter $32a5b$ includes an output terminal connected to the gate electrode of the transistor $32a2b$ via the capacitor $32a3$.

When the feedback signal FB is in an "H" state, the AND circuit $32a4$ outputs the clock signal CLK. In response to this, electrons are transferred from the voltage supply line $L_{VG}$ to the voltage supply line $L_P$, and the voltage of the voltage supply line $L_{VG}$ increases. Meanwhile, when the feedback signal FB is in an "L" state, the AND circuit $32a4$ does not output the clock signal CLK. Therefore, the voltage of the voltage supply line $L_{VG}$ does not increase.

Figure 7:
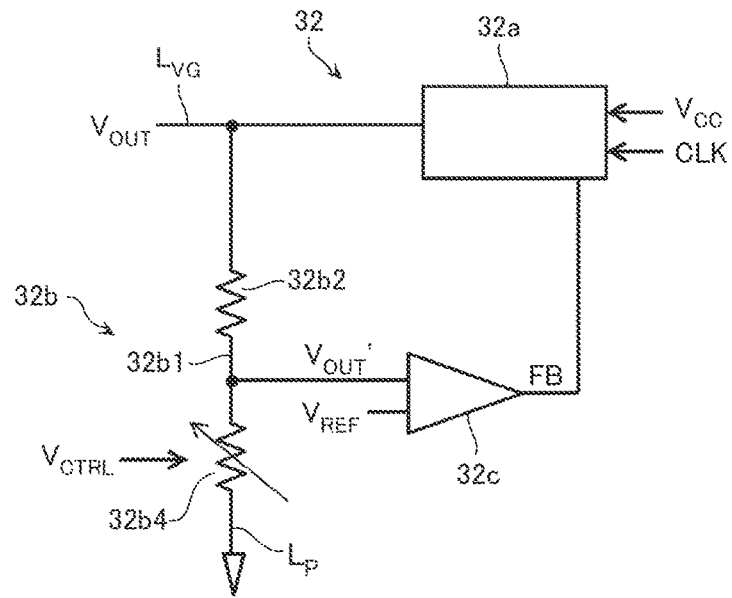
FIG. 7 is a schematic circuit diagram illustrating a part of the configuration of the memory die MD.

As illustrated in FIG. 7, the voltage dividing circuit $32b$ includes a resistor element $32b2$ and a variable resistor element $32b4$. The resistor element $32b2$ is connected between the voltage supply line $L_{VG}$ and a voltage dividing terminal $32b1$. The variable resistor element $32b4$ is connected in series between the voltage dividing terminal $32b1$ and the voltage supply line $L_P$. The voltage supply line $L_P$ is applied with the ground voltage $V_{SS}$. The variable resistor element $32b4$ has a resistance value adjustable in accordance with an operating voltage control signal $V_{CTRL}$. Therefore, a magnitude of a voltage $V_{OUT}'$ of the voltage dividing terminal $32b1$ is adjustable in accordance with the operating voltage control signal $V_{CTRL}$.

Figure 9:
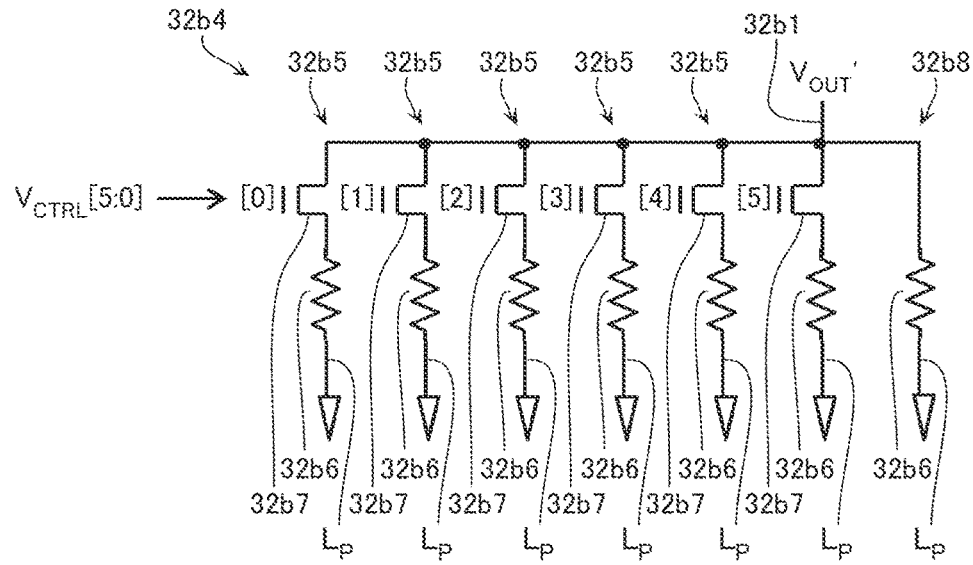
FIG. 9 is a schematic circuit diagram illustrating a part of the configuration of the memory die MD.

As illustrated in FIG. 9, the variable resistor element $32b4$ includes a plurality of current paths $32b5$. The plurality of current paths $32b5$ are connected in parallel between the voltage dividing terminal $32b1$ and the voltage supply lines $L_P$. The plurality of current paths $32b5$ each include a resistor element $32b6$ and a transistor $32b7$ connected in series. The resistor elements $32b6$ disposed in the respective current paths $32b5$ may have mutually different resistance values. Different bits of the operating voltage control signal $V_{CTRL}$ are input to respective gate electrodes of the transistors $32b7$. The variable resistor element $32b4$ may include a current path $32b8$ without the transistor $32b7$.

As illustrated in FIG. 7, the comparator $32c$ outputs the feedback signal FB. The feedback signal FB turns to the "L" state, for example, when the voltage $V_{OUT}'$ of the voltage dividing terminal $32b1$ is larger than the reference voltage $V_{REF}$. The feedback signal FB turns to the "H" state, for example, when the voltage $V_{OUT}'$ is smaller than the reference voltage $V_{REF}$.

[Circuit Configuration of Row Decoder RD]

For example, as illustrated in FIG. 6, the row decoder RD includes a block decoder BLKD, a word line decoder WLD, a driver circuit DRV, and an address decoder (not illustrated).

The block decoder BLKD includes a plurality of block decode units blkd. The plurality of block decode units blkd correspond to the plurality of memory blocks BLK in the memory cell array MCA. The block decode unit blkd includes a plurality of transistors $T_{BLK}$. The plurality of transistors $T_{BLK}$ correspond to the plurality of word lines WL in the memory block BLK. The transistor $T_{BLK}$ is, for example, a field-effect type NMOS transistor. The transistor $T_{BLK}$ includes a drain electrode connected to the word line WL. The transistor $T_{BLK}$ includes a source electrode connected to a wiring CG. The wiring CG is connected to all of the block decode units blkd in the block decoder BLKD. The transistor $T_{BLK}$ includes a gate electrode connected to a signal line BLKSEL. A plurality of the signal lines BLKSEL are disposed corresponding to all of the block decode units blkd. The signal line BLKSEL is connected to all of the transistors $T_{BLK}$ in the block decode unit blkd.

In the read operation, the write operation, and the like, for example, the voltage of one signal line BLKSEL corresponding to a block address in the address register ADR (FIG. 4) turns to the "H" state, and the voltages of the other signal lines BLKSEL turn to the "L" state. For example, the one signal line BLKSEL is applied with a predetermined driving voltage having a positive magnitude, and the other signal lines BLKSEL are applied with the ground voltage $V_{SS}$ or the like. Accordingly, all of the word lines WL in one memory block BLK corresponding to this block address are electrically conductive to all of the wirings CG. All of the word lines WL in the other memory blocks BLK turn to a floating state.

The word line decoder WLD includes a plurality of word line decode units wld. The plurality of word line decode units wld correspond to the plurality of memory cells MC in the memory string MS. In the illustrated example, the word line decode unit wld includes two transistors $T_{WLS}$, $T_{WLU}$. The transistors $T_{WLS}$, $T_{WLU}$ are, for example, field-effect type NMOS transistors. The transistors $T_{WLS}$, $T_{WLU}$ include drain electrodes connected to the wiring CG. The transistor $T_{WLS}$ includes a source electrode connected to a wiring $CG_S$. The transistor $T_{WLU}$ includes a source electrode connected to a wiring $CG_U$. The transistor $T_{WLS}$ includes a gate electrode connected to a signal line $WLSEL_S$. The transistor $T_{WLU}$ includes a gate electrode connected to a signal line $WLSEL_U$. A plurality of the signal lines $WLSEL_S$ are disposed corresponding to the one transistors $T_{WLS}$ included in all of the word line decode units wld. A plurality of the signal lines $WLSEL_U$ are disposed corresponding to the other transistors $T_{WLU}$ included in all of the word line decode units wld.

In the read operation, the write operation, and the like, for example, the voltage of the signal line $WLSEL_S$ corresponding to one word line decode unit wld corresponding to a page address in the address register ADR (FIG. 4) turns to the "H" state, and the voltage of the signal line $WLSEL_U$ corresponding to this turns to the "L" state. The voltages of the signal lines $WLSEL_S$ corresponding to the other word line decode units wld turn to the "L" state, and the voltages of the signal lines $WLSEL_U$ corresponding to them turn to the "H" state. The wiring $CG_S$ is applied with a voltage corresponding to a selected word line $WL_S$. The wiring $CG_U$ is applied with a voltage corresponding to an unselected word line $WL_U$. Accordingly, the one word line WL corresponding to the page address is applied with the voltage corresponding to the selected word line $WL_S$. The other word lines WL are applied with the voltage corresponding to the unselected word line $WL_U$.

The driver circuit DRV includes, for example, six transistors $T_{DRV1}$ to $T_{DRV6}$. The transistors $T_{DRV1}$ to $T_{DRV6}$ are, for example, field-effect type NMOS transistors. The transistors $T_{DRV1}$ to $T_{DRV4}$ include drain electrodes connected to the wiring $CG_S$. The transistors $T_{DRV5}$, $T_{DRV6}$ include drain electrodes connected to the wiring $CG_U$. The transistor $T_{DRV1}$ includes a source electrode connected to an output terminal of the voltage generation unit vg1 via a voltage supply line $L_{VG1}$. The transistors $T_{DRV2}$, $T_{DRV5}$ include source electrodes connected to an output terminal of the voltage generation unit vg2 via a voltage supply line $L_{VG2}$. The transistor $T_{DRV3}$ includes a source electrode connected to an output terminal of the voltage generation unit vg3 via a voltage supply line $L_{VG3}$. The transistors $T_{DRV4}$, $T_{DRV6}$ include source electrodes connected to the pad electrode P described with reference to FIG. 2 and FIG. 3 via the voltage supply line $L_P$. The transistors $T_{DRV1}$ to $T_{DRV6}$ include gate electrodes to which signal lines VSEL1 to VSEL6 are connected, respectively.

In the read operation, the write operation, and the like, for example, one of the voltages of the plurality of signal lines VSEL1 to VSEL4 corresponding to the wiring $CG_S$ turns to the "H" state, and the other voltages turn to the "L" state. One of the voltages of the two signal lines VSEL5, VSEL6 corresponding to the wiring $CG_U$ turns to the "H" state, and the other voltage turns to the "L" state.

The address decoder (not illustrated), for example, sequentially refers to the row address RA of the address register ADR (FIG. 4) in accordance with the control signal from the sequencer SQC (FIG. 4). The row address RA includes the block address and the page address described above. The address decoder controls the voltages of the signal lines BLKSEL, $WLSEL_S$, and $WLSEL_U$ to the "H" state or the "L" state.

In the example of FIG. 6, the row decoder RD includes one block decode unit blkd for each memory block BLK. However, this configuration can be changed as necessary. For example, one block decode unit blkd may be disposed for two or more memory blocks BLK.

[Circuit Configuration of Sense Amplifier Module SAM]

Figure 10:
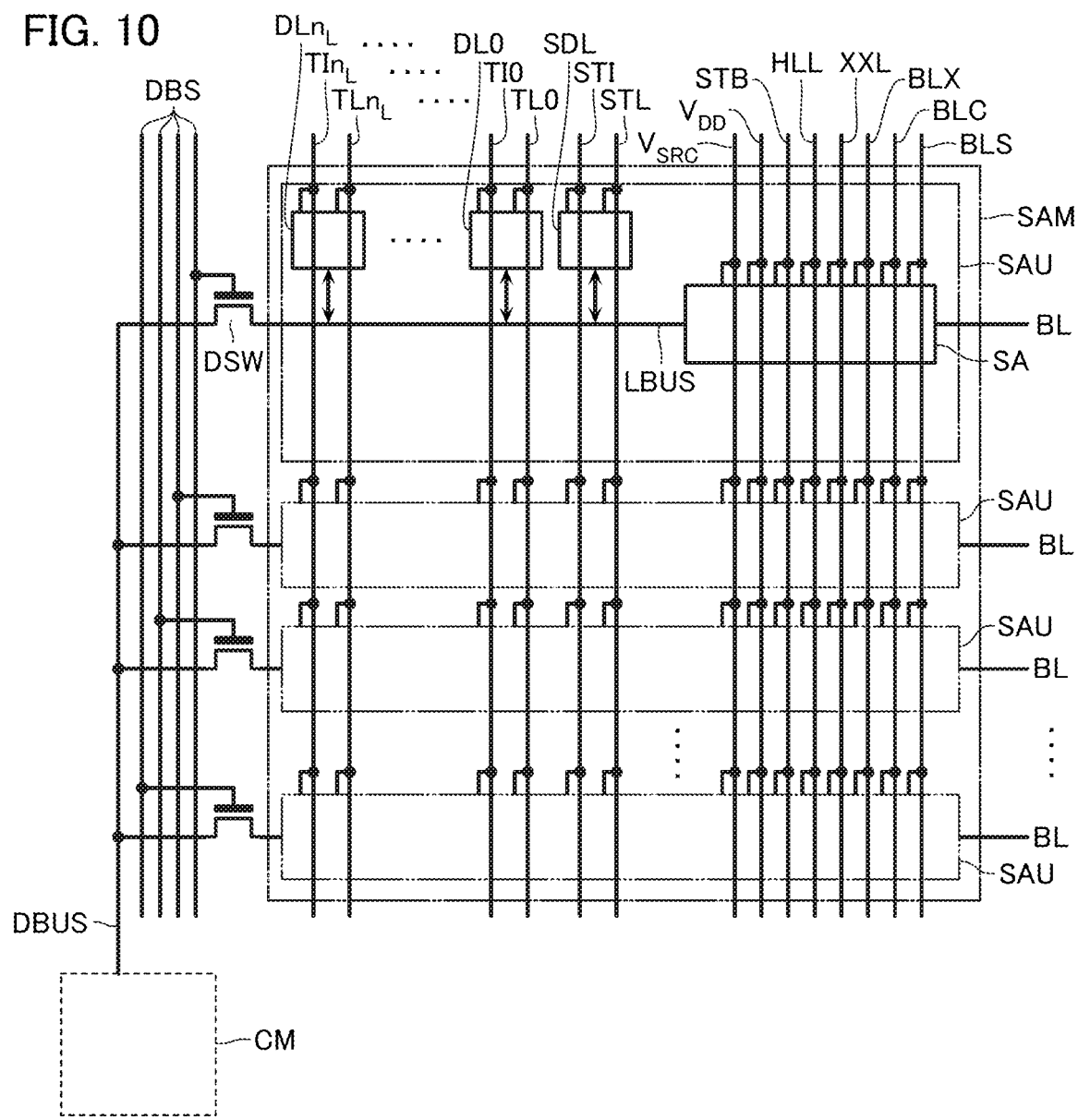
FIG. 10 is a schematic circuit diagram illustrating a part of the configuration of the memory die MD.

For example, as illustrated in FIG. 10, the sense amplifier module SAM (FIG. 4) includes a plurality of sense amplifier units SAU. The plurality of sense amplifier units SAU correspond to the plurality of bit lines BL. The sense amplifier units SAU each include a sense amplifier SA, a wiring LBUS, latch circuits SDL and DL0 to $DLn_L$ ($n_L$ is a natural number). The wiring LBUS is connected to a charge transistor 55 (FIG. 11) for precharge. The wiring LBUS is connected to the wiring DBUS via a switch transistor DSW.

Figure 11:
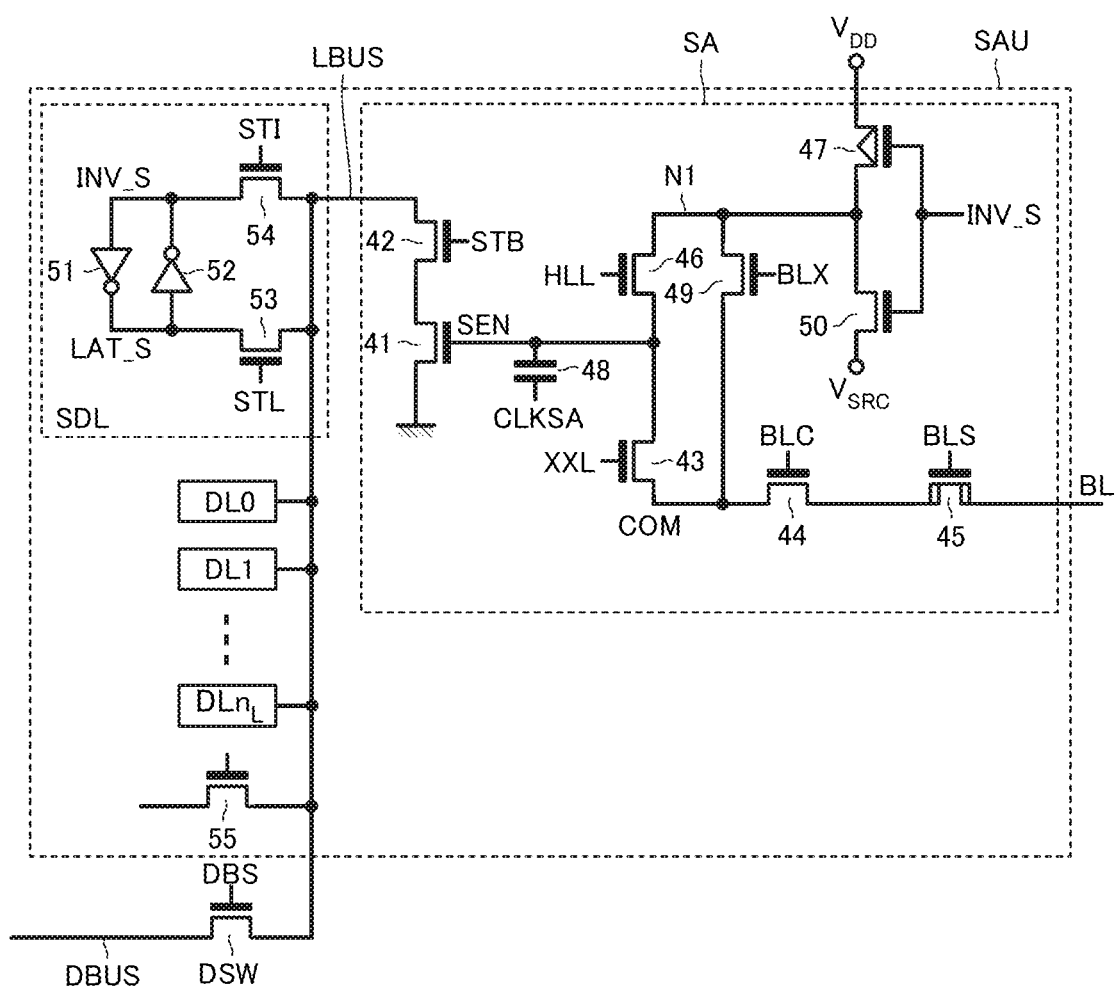
FIG. 11 is a schematic circuit diagram illustrating a part of the configuration of the memory die MD.

As illustrated in FIG. 11, the sense amplifier SA includes a sense transistor 41. The sense transistor 41 discharges an electric charge of the wiring LBUS according to the current flowing in the bit line BL. A source electrode of the sense transistor 41 is connected to the voltage supply line to which the ground voltage $V_{SS}$ is applied. A drain electrode of the sense transistor 41 is connected to the wiring LBUS via a switch transistor 42. A gate electrode of the sense transistor 41 is connected to the bit line BL via a sense node SEN, a discharge transistor 43, a node COM, a clamp transistor 44, and a high breakdown voltage transistor 45. The sense node SEN is connected to an internal control signal line CLKSA via a capacitor 48.

The sense amplifier SA includes a voltage transfer circuit. The voltage transfer circuit selectively electrically conducts the node COM and the sense node SEN with a voltage supply line to which a voltage $V_{DD}$ is applied or a voltage supply line to which a voltage $V_{SRC}$ is applied in accordance with data latched by the latch circuit SDL. The voltage transfer circuit includes a node N1, a charge transistor 46, a charge transistor 49, a charge transistor 47, and a discharge transistor 50. The charge transistor 46 is connected between the node N1 and the sense node SEN. The charge transistor 49 is connected between the node N1 and the node COM. The charge transistor 47 is connected between the node N1 and the voltage supply line to which the voltage $V_{DD}$ is applied. The discharge transistor 50 is connected between the node N1 and the voltage supply line to which the voltage $V_{SRC}$ is applied. The charge transistor 47 and the discharge transistor 50 include gate electrodes commonly connected to a node INV_S of the latch circuit SDL.

The sense transistor 41, the switch transistor 42, the discharge transistor 43, the clamp transistor 44, the charge transistor 46, the charge transistor 49, and the discharge transistor 50 are, for example, enhancement type NMOS transistors. The high breakdown voltage transistor 45 is, for example, a depletion type NMOS transistor. The charge transistor 47 is, for example, a PMOS transistor.

The switch transistor 42 includes a gate electrode connected to a signal line STB. The discharge transistor 43 includes a gate electrode connected to a signal line XXL. The clamp transistor 44 includes a gate electrode connected to a signal line BLC. The high breakdown voltage transistor 45 includes a gate electrode connected to a signal line BLS. The charge transistor 46 includes a gate electrode connected to a signal line HLL. The charge transistor 49 includes a gate electrode connected to a signal line BLX. These signal lines STB, XXL, BLC, BLS, HLL, and BLX are connected to the sequencer SQC.

The latch circuit SDL includes nodes LAT_S, INV_S, an inverter 51, an inverter 52, a switch transistor 53, and a switch transistor 54. The inverter 51 includes an output terminal connected to the node LAT_S and an input terminal connected to the node INV_S. The inverter 52 includes an input terminal connected to the node LAT_S and an output terminal connected to the node INV_S. The switch transistor 53 is disposed in a current path between the node LAT_S and the wiring LBUS. The switch transistor 54 is disposed in a current path between the node INV_S and the wiring LBUS. The switch transistors 53, 54 are, for example, NMOS transistors. The switch transistor 53 includes a gate electrode connected to the sequencer SQC via a signal line STL. The switch transistor 54 includes a gate electrode connected to the sequencer SQC via a signal line STI.

The latch circuits DL0 to $DLn_L$ are configured almost similarly to the latch circuit SDL. However, as described above, the node INV_S of the latch circuit SDL is conductive to the gate electrodes of the charge transistor 47 and the discharge transistor 50 in the sense amplifier SA. In this respect, the latch circuits DL0 to $DLn_L$ are different from the latch circuit SDL.

The switch transistor DSW is, for example, an NMOS transistor. The switch transistor DSW is connected between the wiring LBUS and the wiring DBUS. The switch transistor DSW includes a gate electrode connected to the sequencer SQC via a signal line DBS.

As illustrated in FIG. 10, the above-described signal lines STB, HLL, XXL, BLX, BLC, and BLS are each connected to all of the sense amplifier units SAU included in the sense amplifier module SAM in common. The voltage supply line to which the voltage $V_{DD}$ is applied and the voltage supply line to which the voltage $V_{SRC}$ is applied are each connected to all of the sense amplifier units SAU included in the sense amplifier module SAM in common. The signal line STI and the signal line STL of the latch circuit SDL are each connected to all of the sense amplifier units SAU included in the sense amplifier module SAM in common. Similarly, the signal lines TI0 to $TIn_L$, TL0 to $TLn_L$ corresponding to the signal line STI and the signal line STL in the latch circuits DL0 to $DLn_L$ are each connected to all of the sense amplifier units SAU included in the sense amplifier module SAM in common. Meanwhile, a plurality of the signal lines DBS are disposed corresponding to all of the respective sense amplifier units SAU included in the sense amplifier module SAM.

[Circuit Configuration of Cache Memory CM]

The cache memory CM (FIG. 4) includes a plurality of latch circuits. The plurality of latch circuits are connected to the latch circuits in the sense amplifier module SAM via the wiring DBUS. Data DAT included in these plurality of latch circuits is sequentially transferred to the sense amplifier module SAM or the input/output control circuit I/O.

A decode circuit and a switch circuit (not illustrated) are connected to the cache memory CM. The decode circuit decodes a column address CA latched in the address register ADR. The switch circuit causes the latch circuit corresponding to the column address CA to be electrically conductive with a bus DB (FIG. 4) in response to the output signal of the decode circuit.

[Circuit Configuration of Sequencer SQC]

The sequencer SQC (FIG. 4) outputs an internal control signal to the row decoder RD, the sense amplifier module SAM, and the voltage generation circuit VG in accordance with command data ID=latched in a command register CMR. The sequencer SQC outputs status data $D_{ST}$ indicating a status of itself to the status register STR as necessary.

The sequencer SQC generates a ready/busy signal and outputs it to a terminal RY//BY. In a period in which the voltage of the terminal RY//BY is in the "L" state (busy period), an access to the memory die MD is basically inhibited. In a period in which the voltage of the terminal RY//BY is in the "H" state (ready period), the access to the memory die MD is permitted. The terminal RY//BY is achieved by, for example, the pad electrode P described with reference to FIG. 2 and FIG. 3.

[Circuit Configuration of Input/Output Control Circuit I/O]

The input/output control circuit I/O includes data signal input/output terminals DQ0 to DQ7, toggle signal input/output terminals DQS, /DQS, a plurality of input circuits, a plurality of output circuits, a shift register, and a buffer circuit. The plurality of input circuits, the plurality of output circuits, the shift register, and the buffer circuit are each connected to terminals to which a power supply voltage $V_{CCQ}$ and the ground voltage $V_{SS}$ are applied.

The data signal input/output terminals DQ0 to DQ7, the toggle signal input/output terminals DQS, /DQS, and the terminal to which the power supply voltage $V_{CCQ}$ is applied are achieved by, for example, the pad electrodes P described with reference to FIG. 2 and FIG. 3. The data input via the data signal input/output terminals DQ0 to DQ7 is output to the cache memory CM, the address register ADR, or the command register CMR from the buffer circuit in response to the internal control signal from the logic circuit CTR. The data output via the data signal input/output terminals DQ0 to DQ7 is input to the buffer circuit from the cache memory CM or the status register STR in response to the internal control signal from the logic circuit CTR.

The plurality of input circuits include, for example, a comparator connected to any of the data signal input/output terminals DQ0 to DQ7 or both of the toggle signal input/output terminals DQS, /DQS. The plurality of output circuits include, for example, an Off Chip Driver (OCD) circuit connected to any of the data signal input/output terminals DQ0 to DQ7 or any of the toggle signal input/output terminals DQS, /DQS.

[Circuit Configuration of Logic Circuit CTR]

The logic circuit CTR (FIG. 4) receives an external control signal from the controller die CD via external control terminals /CEn, CLE, ALE, /WE, RE, /RE, and outputs the internal control signal to the input/output control circuit I/O in response to the external control signal. The external control terminals /CEn, CLE, ALE, /WE, RE, /RE are achieved by, for example, the pad electrodes P described with reference to FIG. 2 and FIG. 3.

[Structure of Memory Die MD]

Figure 12:
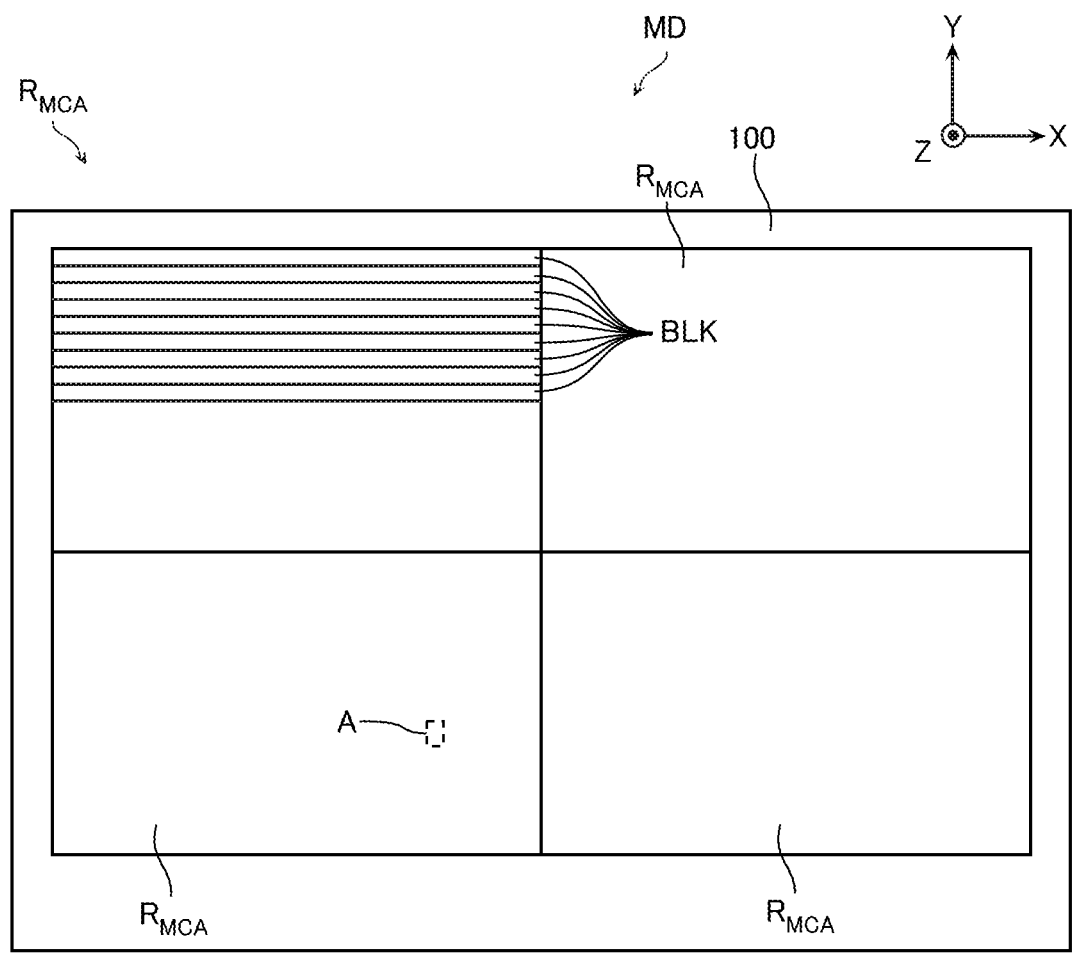
FIG. 12 is a schematic plan view of the memory die MD.
Figure 13:
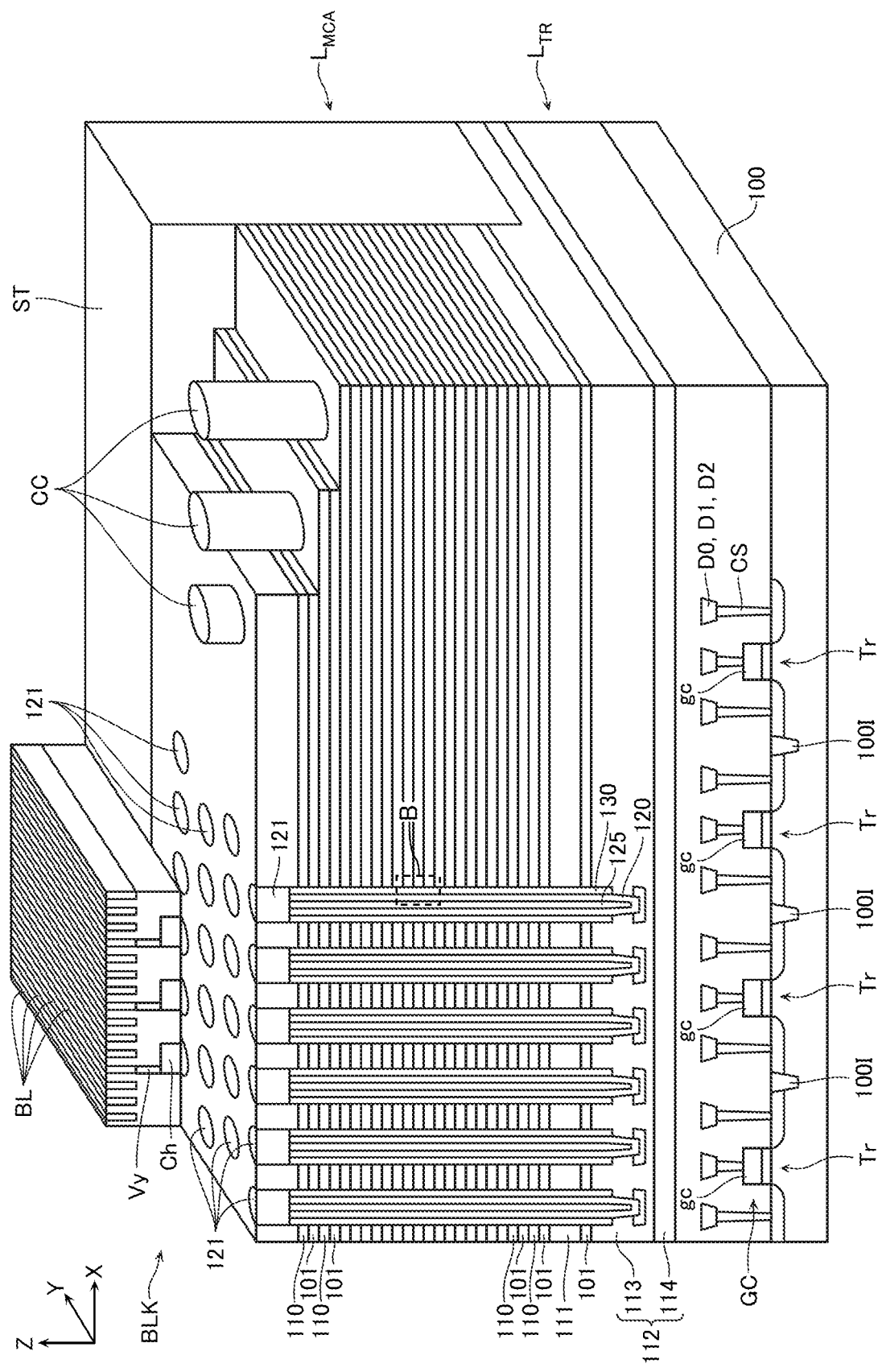
FIG. 13 is a schematic perspective view of the memory die MD.
Figure 14:
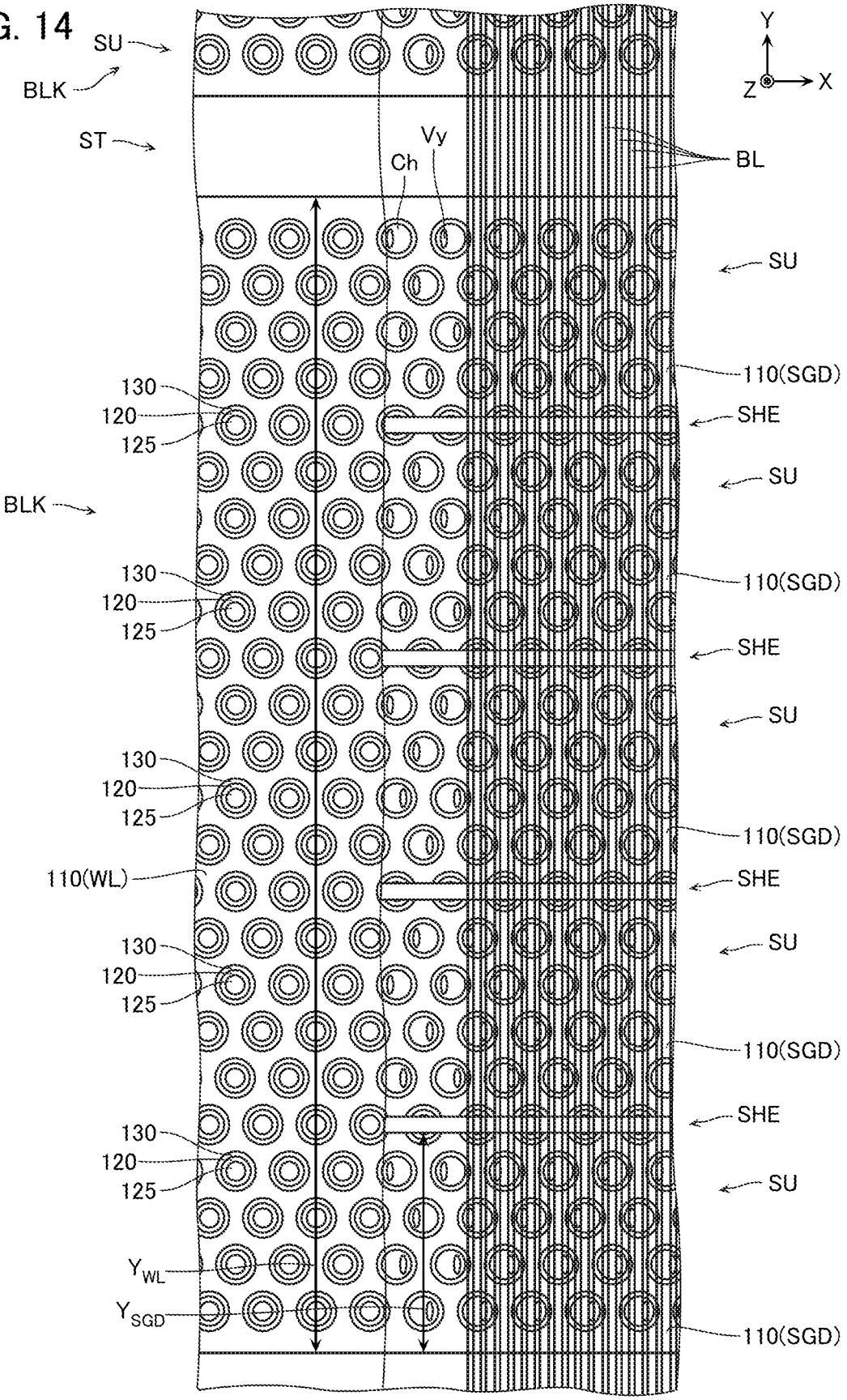
FIG. 14 is a schematic enlarged view of a part indicated by A in FIG. 12.
Figure 15:
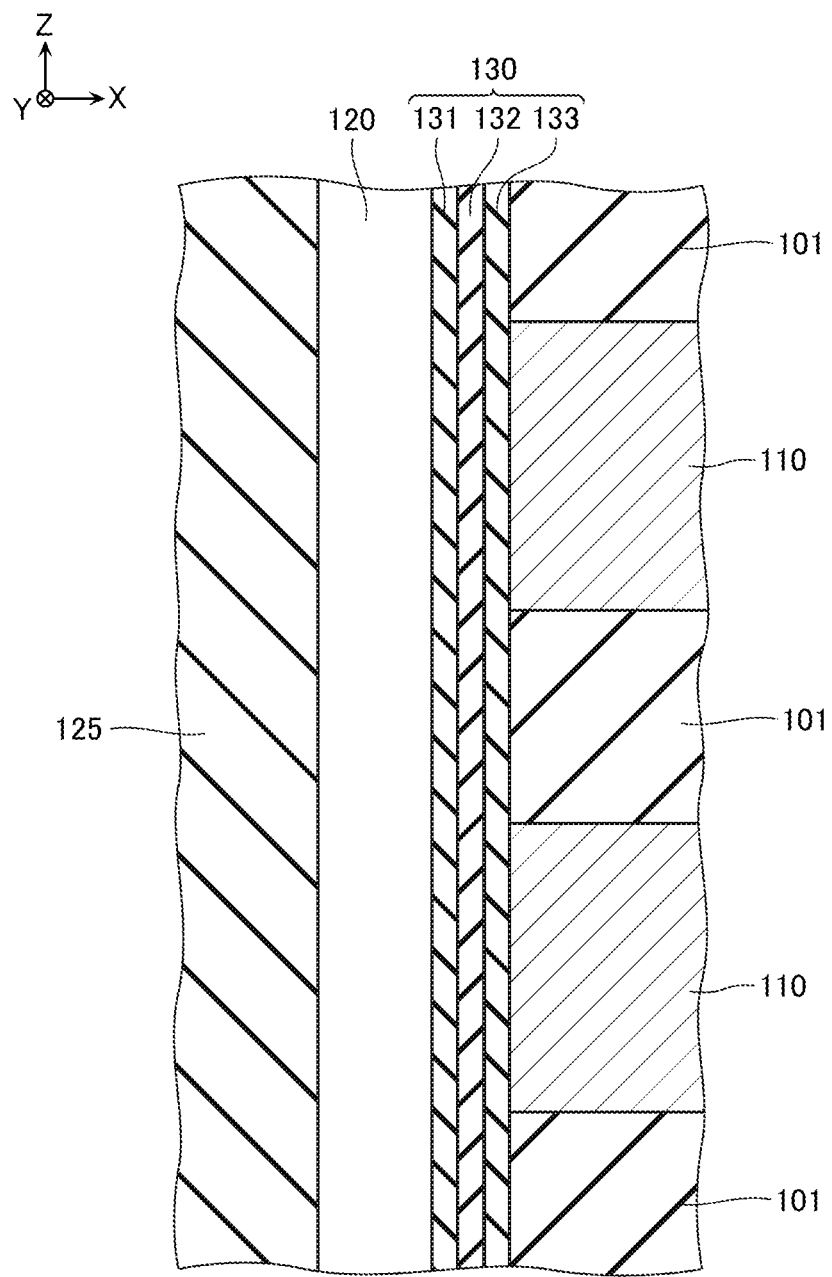
FIG. 15 is a schematic enlarged view of a part indicated by B in FIG. 13.

FIG. 12 is a schematic plan view of the memory die MD. FIG. 13 is a schematic perspective view of the memory die MD. FIG. 13 is a drawing for describing the schematic configuration of the memory die MD, and does not indicate the specific number, shapes, arrangement, and the like of components. FIG. 14 is a schematic enlarged view of a part indicated by A in FIG. 12. FIG. 15 is a schematic enlarged view of a part indicated by B in FIG. 13. In a part of the region in FIG. 14, the bit lines BL are omitted. In a part of the region in FIG. 14, the drain-side select gate lines SGD are omitted.

For example, as illustrated in FIG. 12, the memory die MD includes a semiconductor substrate 100. In the illustrated example, the semiconductor substrate 100 includes four memory cell array regions $R_{MCA}$ arranged in the X-direction and the Y-direction.

For example, as illustrated in FIG. 13, the memory die MD includes the semiconductor substrate 100, a transistor layer $L_{TR}$ disposed above the semiconductor substrate 100, a memory cell array layer $L_{MCA}$ disposed above the transistor layer $L_{TR}$, and a wiring layer (not illustrated) disposed above the memory cell array layer $L_{MCA}$.

[Structure of Semiconductor Substrate 100]

For example, the semiconductor substrate 100 is formed of a P-type silicon (Si) containing P-type impurities, such as boron (B). On a surface of the semiconductor substrate 100, an N-type well region containing N-type impurities, such as phosphorus (P), a P-type well region containing P-type impurities, such as boron (B), a semiconductor substrate region in which the N-type well region or the P-type well region is not disposed, and an insulating region 1001 are disposed.

[Structure of Transistor Layer $L_{TR}$]

For example, as illustrated in FIG. 13, a wiring layer GC is disposed above an upper surface of the semiconductor substrate 100 via the insulating layer. The wiring layer GC includes a plurality of electrodes gc opposed to the surface of the semiconductor substrate 100. These respective plurality of electrodes gc function as gate electrodes of a plurality of transistors Tr, electrodes of a plurality of capacitors, or the like constituting the peripheral circuit PC. These plurality of electrodes gc are connected to respective contacts CS. The contact CS may include, for example, a stacked film of a barrier conductive film, such as titanium nitride (TiN), and a metal film, such as tungsten (W). These plurality of contacts CS are connected to a plurality of wirings included in wiring layers D0, D1, and D2. Each of these plurality of wirings may include, for example, a stacked film of a barrier conductive film, such as titanium nitride (TiN), and a metal film, such as tungsten (W).

[Structure of Memory Cell Array Layer $L_{MCA}$]

For example, as illustrated in FIG. 12, the memory cell array layer $L_{MCA}$ includes a plurality of memory blocks BLK arranged in the Y-direction. The memory block BLK includes, for example, as illustrated in FIG. 14, a plurality of string units SU arranged in the Y-direction. Between the two memory blocks BLK mutually adjacent in the Y-direction, an inter-block insulating layer ST of silicon oxide ($SiO_2$) or the like is disposed. For example, as illustrated in FIG. 14, between the two string units SU mutually adjacent in the Y-direction, an inter-string unit insulating layer SHE of silicon oxide ($SiO_2$) or the like is disposed.

For example, as illustrated in FIG. 13, the memory block BLK includes a plurality of conductive layers 110 arranged in the Z-direction, a plurality of semiconductor layers 120 extending in the Z-direction, and a plurality of gate insulating films 130 disposed between the plurality of conductive layers 110 and the respective plurality of semiconductor layers 120.

The conductive layer 110 is an approximately plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the respective adjacent conductive layers 110 arranged in the Z-direction, insulating layers 101 (FIG. 15) of silicon oxide ($SiO_2$) or the like are disposed. A contact electrode CC extending in the Z-direction is disposed in one end portion in the X-direction of the conductive layer 110.

A conductive layer 111 is disposed below the conductive layer 110, for example, as illustrated in FIG. 13. For example, the conductive layer 111 may contain polycrystalline silicon containing impurities, such as phosphorus (P) or boron (B). Between the conductive layer 111 and the conductive layer 110, an insulating layer 101 is disposed.

A conductive layer 112 is disposed below the conductive layer 111. The conductive layer 112 may contain, for example, polycrystalline silicon containing impurities, such as phosphorus (P) or boron (B). The conductive layer 112 may include, for example, a conductive layer of a metal, such as tungsten (W), tungsten silicide, or the like or another conductive layer. Between the conductive layer 112 and the conductive layer 111, an insulating layer 101 is disposed.

The conductive layer 112 functions as the source line SL (FIG. 5). The conductive layer 112 is, for example, disposed in common between all of the memory blocks BLK included in the memory cell array region $R_{MCA}$ (FIG. 12).

The conductive layer 111 functions as the source-side select gate line SGSb (FIG. 5) and gate electrodes of the plurality of source-side select transistors STSb connected thereto. The conductive layer 111 is electrically independent for each memory block BLK.

Among the plurality of conductive layers 110, one or the plurality of conductive layers 110 positioned at the lowermost layer function as the source-side select gate line SGS (FIG. 5) and gate electrodes of the plurality of source-side select transistors STS connected thereto. These plurality of conductive layers 110 are electrically independent for each memory block BLK.

The plurality of conductive layers 110 positioned above these conductive layers 110 function as the word lines WL (FIG. 5) and the gate electrodes of the plurality of memory cells MC (FIG. 5) connected thereto. These plurality of conductive layers 110 are electrically independent for each memory block BLK.

One or the plurality of conductive layers 110 positioned above these conductive layers 110 function as the drain-side select gate line SGD and gate electrodes of the plurality of drain-side select transistors STD (FIG. 5) connected thereto. These plurality of conductive layers 110 have widths $Y_{SGD}$ in the Y-direction smaller than width $Y_{WL}$ in the Y-direction of the other conductive layers 110, for example, as illustrated in FIG. 14. Between the two conductive layers 110 adjacent in the Y-direction, the above-described inter-string unit insulating layer SHE is disposed, for example, as illustrated in FIG. 14. These plurality of conductive layers 110 are electrically independent for each string unit SU.

For example, as illustrated in FIG. 14, the semiconductor layers 120 are arranged in a predetermined pattern in the X-direction and the Y-direction. The semiconductor layers 120 function as channel regions of the plurality of memory cells MC and the select transistors (STD, STS, STSb) included in one memory string MS (FIG. 5). The semiconductor layer 120 is, for example, a semiconductor layer of polycrystalline silicon (Si) or the like. The semiconductor layer 120 has, for example, as illustrated in FIG. 13, an approximately cylindrical shape and includes an insulating layer 125 of silicon oxide or the like at its center part.

The semiconductor layers 120 have outer peripheral surfaces each surrounded by the plurality of conductive layers 110 and the conductive layer 111 and opposed to these plurality of conductive layers 110 and the conductive layer 111. The semiconductor layer 120 has a lower end connected to the conductive layer 112. The semiconductor layer 120 has an upper end connected to the bit line BL via contacts Ch, Vy. The bit lines BL extend in the Y-direction and are arranged in the X-direction.

The gate insulating film 130 has an approximately cylindrical shape that covers the outer peripheral surface of the semiconductor layer 120. For example, as illustrated in FIG. 15, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 are, for example, insulating films of silicon oxide ($SiO_2$) or the like. The electric charge accumulating film 132 is, for example, a film of silicon nitride ($Si_3N_4$) or the like that can accumulate an electric charge. The tunnel insulating film 131, the electric charge accumulating film 132, and the block insulating film 133, which have approximately cylindrical shapes, extend in the Z-direction along the outer peripheral surface of the semiconductor layer 120 excluding a contact portion of the semiconductor layer 120 and the conductive layer 112.

FIG. 15 illustrates an example in which the gate insulating film 130 includes the electric charge accumulating film 132 of silicon nitride or the like. However, the gate insulating film 130 may include, for example, a floating gate of polycrystalline silicon containing N-type or P-type impurities or the like.

[Threshold Voltage of Memory Cell MC]

Next, the threshold voltage of the memory cell MC will be described with reference to FIG. 16A, FIG. 16B, and FIG. 16C.

Figures 16A, 16B, 16C:
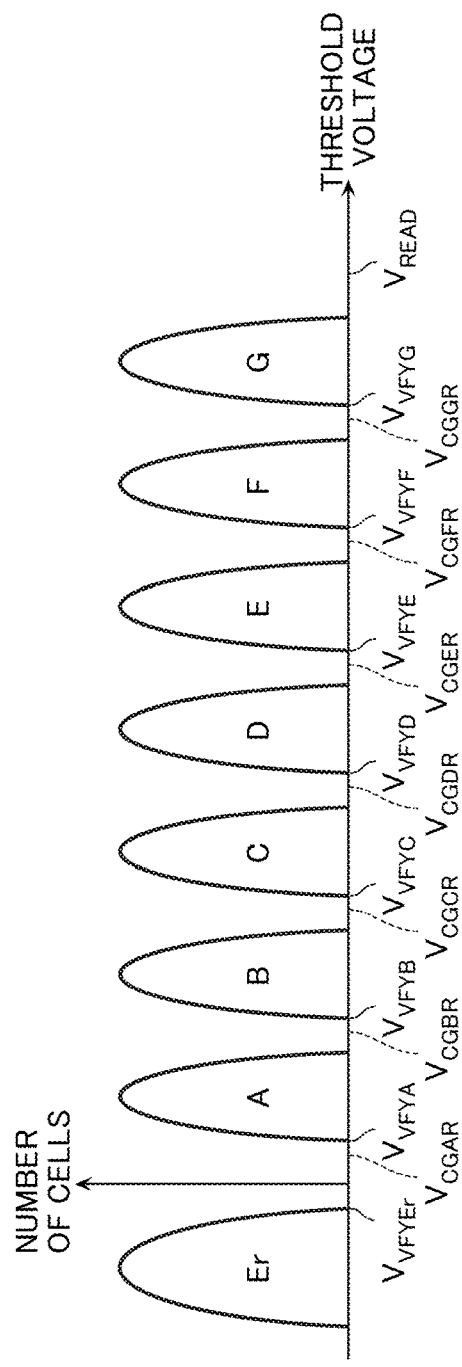
FIG. 16A is a schematic histogram for describing a threshold voltage of a memory cell MC that stores 3-bit data.
FIG. 16B is a table illustrating an exemplary relation between the threshold voltage of the memory cell MC that stores the 3-bit data and the stored data.
FIG. 16C is a table illustrating another exemplary relation between the threshold voltage of the memory cell MC that stores the 3-bit data and the stored data.

FIG. 16A is a schematic histogram for describing the threshold voltage of the memory cell MC that stores 3-bit data. The horizontal axis indicates the voltage of the word line WL, and the vertical axis indicates the number of the memory cells MC. FIG. 16B is a table illustrating an exemplary relation between the threshold voltage of the memory cell MC that stores the 3-bit data and the stored data. FIG. 16C is a table illustrating another exemplary relation between the threshold voltage of the memory cell MC that stores the 3-bit data and the stored data.

In the example of FIG. 16A, the threshold voltages of the memory cells MC are controlled in states of eight patterns. The threshold voltage of the memory cell MC controlled in a state Er is smaller than an erase verify voltage $V_{VFYEr}$. For example, the threshold voltage of the memory cell MC controlled in a state A is larger than a verify voltage $V_{VFYA}$ and smaller than a verify voltage $V_{VFYB}$. Additionally, for example, the threshold voltage of the memory cell MC controlled in a state B is larger than the verify voltage $V_{VFYB}$ and smaller than a verify voltage $V_{VFYC}$. Hereinafter, similarly, the threshold voltages of the memory cells MC controlled in a state C to a state F are larger than the verify voltage $V_{VFYC}$ to a verify voltage $V_{VFYF}$ and smaller than a verify voltage $V_{VFYD}$ to a verify voltage $V_{VFYG}$, respectively. For example, the threshold voltage of the memory cell MC controlled in a state G is larger than the verify voltage $V_{VFYG}$ and smaller than a read pass voltage $V_{READ}$.

In the example in FIG. 16A, a read voltage $V_{CGAR}$ is set between a threshold distribution corresponding to the state Er and a threshold distribution corresponding to the state A. A read voltage $V_{CGBR}$ is set between the threshold distribution corresponding to the state A and a threshold distribution corresponding to the state B. The same applies to the following, and a read voltage $V_{CGCR}$ to a read voltage $V_{CGGR}$ are respectively set between the threshold distribution corresponding to the state B and a threshold distribution corresponding to the state C to between a threshold distribution corresponding to the state F and a threshold distribution corresponding to the state G.

For example, the state Er corresponds to the lowest threshold voltage. The memory cell MC of the state Er is, for example, the memory cell MC in an erase state. For example, data "111" is assigned to the memory cell MC of the state Er.

The state A corresponds to the threshold voltage higher than the threshold voltage corresponding to the state Er. For example, data "101" is assigned to the memory cell MC of the state A.

The state B corresponds to the threshold voltage higher than the threshold voltage corresponding to the state A. For example, data "001" is assigned to the memory cell MC of the state B.

Hereinafter, similarly, the state C to the state G in the drawing correspond to threshold voltages higher than threshold voltages corresponding to the state B to the state F. For example, data "011", "010", "110", "100", and "000" are assigned to the memory cells MC of these states.

In the case of the assignment as exemplified in FIG. 16B, the data of a low-order bit is distinguishable with one read voltage $V_{CGDR}$. The data of a middle-order bit is distinguishable with three read voltages $V_{CGAR}$, $V_{CGCR}$, $V_{CGFR}$. The data of a high-order bit is distinguishable with three read voltages $V_{CGBR}$, $V_{CGER}$, $V_{CGGR}$.

The number of bits of the data stored in the memory cell MC, the number of states, the assignment of the data to each state, and the like are changeable as necessary.

For example, in the case of the assignment as exemplified in FIG. 16C, the data of the low-order bit is distinguishable with one read voltage $V_{CGDR}$ The data of the middle-order bit is distinguishable with the two read voltages $V_{CGBR}$, $V_{CGFR}$. The data of the high-order bit is distinguishable with the four read voltages $V_{CGAR}$, $V_{CGCR}$, $V_{CGER}$, $V_{CGGR}$.

[Read Operation]

Next, the read operation of the semiconductor memory device according to this embodiment will be described.

Figure 17:
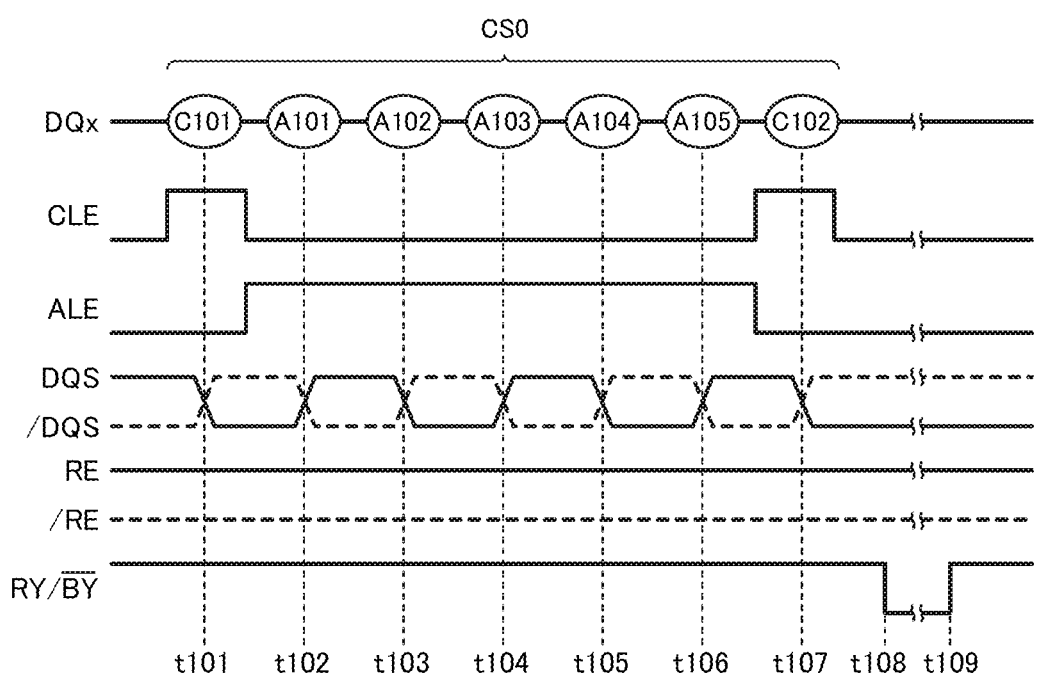
FIG. 17 is a timing chart for describing a read operation.

FIG. 17 is a timing chart for describing the read operation.

FIG. 17 illustrates an example of a command set CS0 input to the memory die MD in the read operation. This command set CS0 includes data C101, A101, A102, A103, A104, and A105, and data C102.

At timing t101, the controller die CD inputs the data C101 to the memory die MD as command data $D_{CMD}$ (FIG. 4). That is, the voltages of the data signal input/output terminals DQ0 to DQ7 are set to "H" or "L" according to the respective bits of the data C101, "H" is input to the external control terminal CLE, and "L" is input to the external control terminal ALE. In this state, input signals of the toggle signal input/output terminals DQS, /DQS are switched, or the external control terminal/WE is raised from "L" to "H". The data C101 is a command input at the start of the read operation.

At timing t102, the controller die CD inputs the data A101 to the memory die MD as address data $D_{ADD}$ (FIG. 4). That is, the voltages of the data signal input/output terminals DQ0 to DQ7 are set to "H" or "L" according to the respective bits of the data A101, "L" is input to the external control terminal CLE, and "H" is input to the external control terminal ALE. In this state, the input signals of the toggle signal input/output terminals DQS, /DQS are switched, or the external control terminal/WE is raised from "L" to "H". The data A101 is a part of the column address CA.

At timing t103, the controller die CD inputs the data A102 to the memory die MD as the address data $D_{ADD}$ (FIG. 4). The data A102 is a part of the column address CA.

At timing t104, the controller die CD inputs the data A103 to the memory die MD as the address data $D_{ADD}$ (FIG. 4). The data A103 is a part of the row address RA. The data A103 includes, for example, a block address and a page address. The block address is data to identify the memory block BLK. The page address is data to identify the string unit SU and the word line WL.

At timing t105, the controller die CD inputs the data A104 to the memory die MD as the address data $D_{ADD}$ (FIG. 4). The data A104 is a part of the row address RA. The data A104 includes, for example, the block address and the page address.

At timing t106, the controller die CD inputs the data A105 to the memory die MD as the address data $D_{ADD}$ (FIG. 4). The data A105 includes a chip address. The chip address is data to identify one memory die MD from the plurality of memory dies MD controlled by the controller die CD.

At timing t107, the controller die CD inputs the data C102 to the memory die MD as the command data $D_{CMD}$ (FIG. 4). The data C102 is a command indicative of the termination of the input of the command set CS0 regarding the read operation.

At timing t108, the voltage of the terminal RY//BY turns to the "L" state from the "H" state and an access to the memory die MD is inhibited. The read operation is performed in the memory die MD.

At timing t109, the read operation in the memory die MD terminates. Additionally, the voltage of the terminal RY//BY turns to the "H" state from the "L" state and the access to the memory die MD is permitted.

Figure 18:
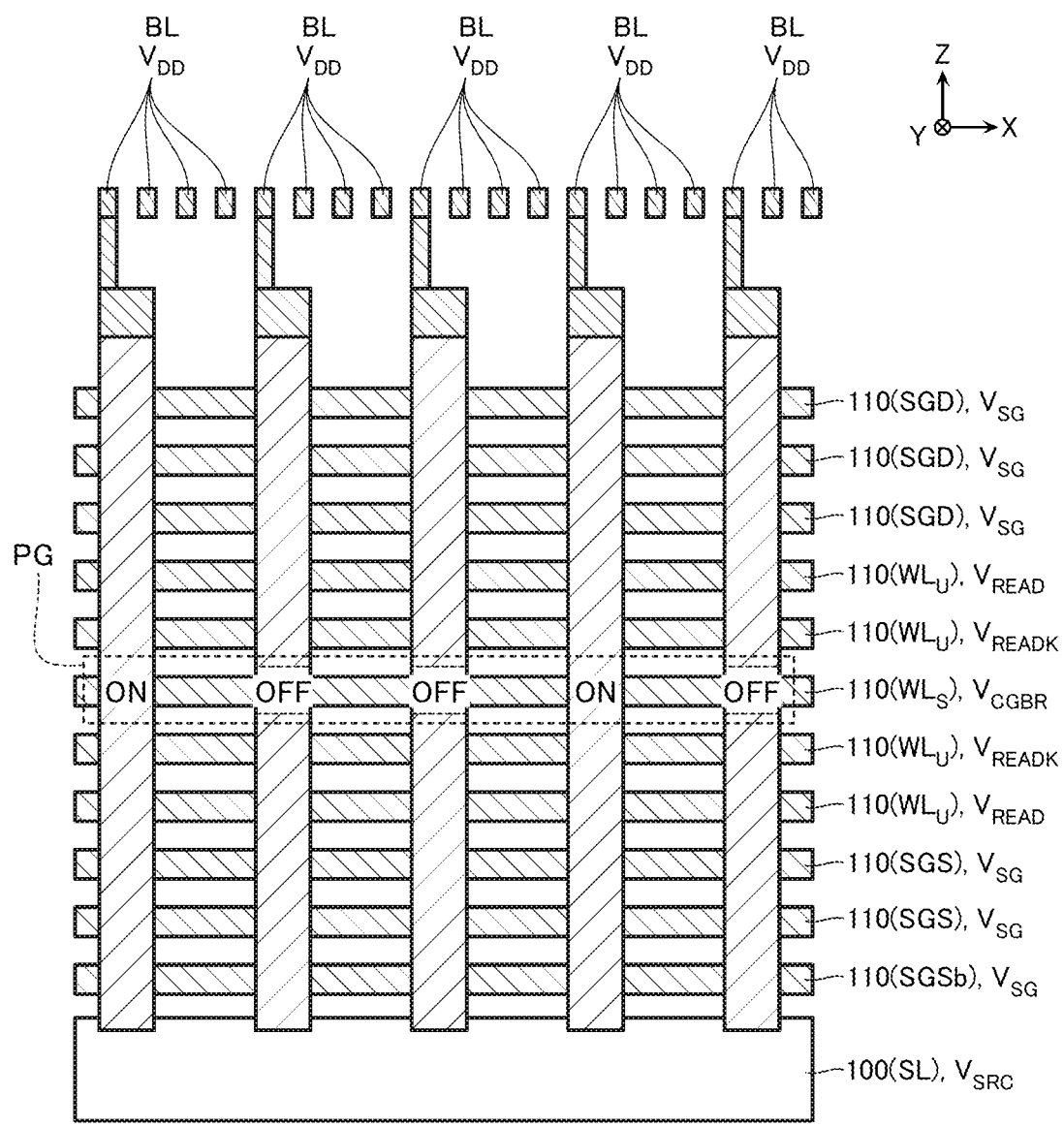
FIG. 18 is a schematic cross-sectional view for describing the read operation.
Figure 19:
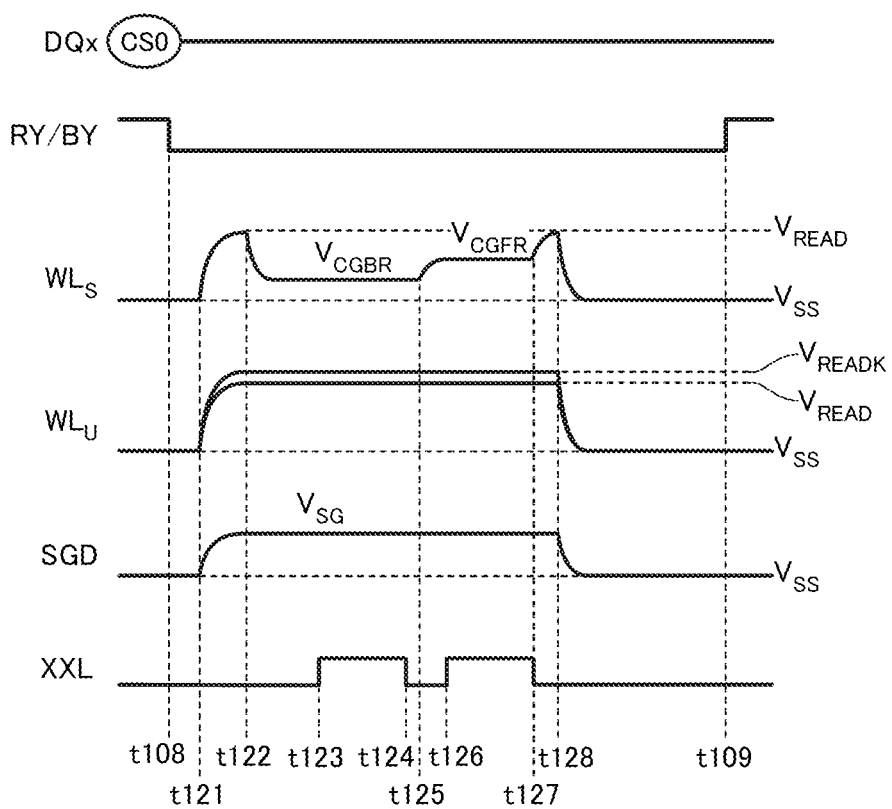
FIG. 19 is a timing chart for describing the read operation.

FIG. 18 is a schematic cross-sectional view for describing the read operation. FIG. 19 is a timing chart for describing the read operation.

In the following description, the word line WL that is a target of the operation may be referred to as "selected word line $WL_S$" and the word line WL other than the target of the operation may be referred to as "unselected word line $WL_U$". In the following description, an example where the read operation is performed on the memory cell MC connected to the selected word line $WL_S$ (hereinafter sometimes referred to as "selected memory cell MC") among the plurality of memory cells MC included in the string unit SU as a target of the operation will be described. In the following description, the configuration including such a plurality of selected memory cells MC may be referred to as a selected page PG.

In the following description, the data is assigned to each memory cell MC in a way as described with reference to FIG. 16C, and an example of reading out the data of middle-order bit will be described.

For example, as illustrated in FIG. 19, at timing t121 in the read operation, the selected word line $WL_S$ is applied with the read pass voltage $V_{READ}$, the two unselected word lines $WL_U$ adjacent to the selected word line $WL_S$ in the Z-direction are applied with a read pass voltage $V_{READK}$, and the other unselected word lines $WL_U$ are applied with the read pass voltage $V_{READ}$ The read pass voltage $V_{READK}$ is larger than the read pass voltage $V_{READ}$. Accordingly, all of the memory cells MC are turned to the ON state. The select gate lines (SGD, SGS, SGSb) are applied with the voltage $V_{SG}$ The voltage $V_{SG}$ has a magnitude enough to form electron channels in the channel regions of the select transistors (STD, STS, STSb), thereby causing the select transistors (STD, STS, STSb) to be in the ON state.

At timing t122 in the read operation, for example, the selected word line $WL_S$ is applied with the read voltage $V_{CGBR}$ (FIG. 16A). Accordingly, for example, as illustrated in FIG. 18, a part of the selected memory cells MC are turned to the ON state, and the other selected memory cells MC are turned to the OFF state.

At timing t122, for example, the bit lines BL are charged. For example, the latch circuit SDL in FIG. 11 is caused to latch "H" to set states of the signal lines STB, XXL, BLC, BLS, HLL, BLX to "L, L, H, H, H, H". Thus, the voltage $V_{DD}$ is applied to the bit lines BL and the sense node SEN, and charging of them starts. For example, the voltage $V_{SRC}$ is applied to the source line SL (FIG. 5). The voltage $V_{SRC}$, for example, has about the same magnitude as a magnitude of the ground voltage $V_{SS}$. The voltage $V_{SRC}$ may be a voltage, for example, slightly larger than the ground voltage $V_{SS}$ and sufficiently smaller than the voltage $V_{DD}$.

From timing t123 to timing t124 in the read operation, for example, as illustrated in FIG. 19, the ON state/OFF state of the memory cell MC is detected by the sense amplifier module SAM (FIG. 11), and data indicating the state of this memory cell MC is obtained. For example, in a state where a predetermined bit line voltage is applied to the bit line BL (FIG. 5), the sense node of the sense amplifier SA (FIG. 11) is electrically conducted with the bit line BL for a certain period. After performing the sense operation, the sense transistor is electrically conducted with the wiring LBUS (FIG. 11), and the electric charge of the wiring LBUS is discharged or maintained. Any of the latch circuits in the sense amplifier unit SAU is electrically conducted with the wiring LBUS, and the data of the wiring LBUS is latched by this latch circuit.

At timing t125 in the read operation, for example, the selected word line $WL_S$ is applied with the read voltage $V_{CGFR}$ (FIG. 16A). Accordingly, a part of the selected memory cells MC is turned to the ON state, and the other selected memory cells MC are turned to the OFF state.

From timing t126 to timing t127 in the read operation, for example, as illustrated in FIG. 19, the ON state/OFF state of the memory cell MC is detected by the sense amplifier module SAM (FIG. 11), and the data indicating the state of this memory cell MC is obtained.

At timing t127 in the read operation, the read pass voltage $V_{READ}$ is applied to the selected word line $WL_S$, and all of the memory cells MC are turned to the ON state.

At timing t128 in the read operation, the ground voltage $V_{SS}$ is applied to the selected word line $WL_S$, the unselected word line $WL_U$, and the select gate lines (SGD, SGS, SGSb).

In the read operation, an arithmetic operation, such as AND and OR, is executed on the data indicating the state of the memory cell MC, thereby calculating the data stored in the memory cell MC. This data is transferred to the cache memory CM (FIG. 4) via the wiring LBUS (FIG. 11), the switch transistor DSW, and a wiring DBUS.

[Operating Current during Read Operation]

As described with reference to FIG. 19, from timing t121 to timing t122 in the read operation, all of the word lines WL included in the selected memory block BLK are charged to the read pass voltage $V_{READ}$. Here, in association with the high integration of the semiconductor memory device, the number of the conductive layers 110 (FIG. 13) stacked in the Z-direction has been increasing. In association with this, the electric charge amount necessary for charging the word line WL has increased, and the operating current flowing in the pad electrode P to which the power supply voltage $V_{CC}$ is applied has been increasing. In association with this, the power consumption and the amount of heat generation increase in some cases. For reducing such an operating current, for example, the time period from timing t121 to timing t122 can be lengthened to reduce the amount of electric charge moving in a unit time. However, in this case, a time period necessary for the read operation is lengthened in some cases.

[Read Standby Mode]

Figure 20:
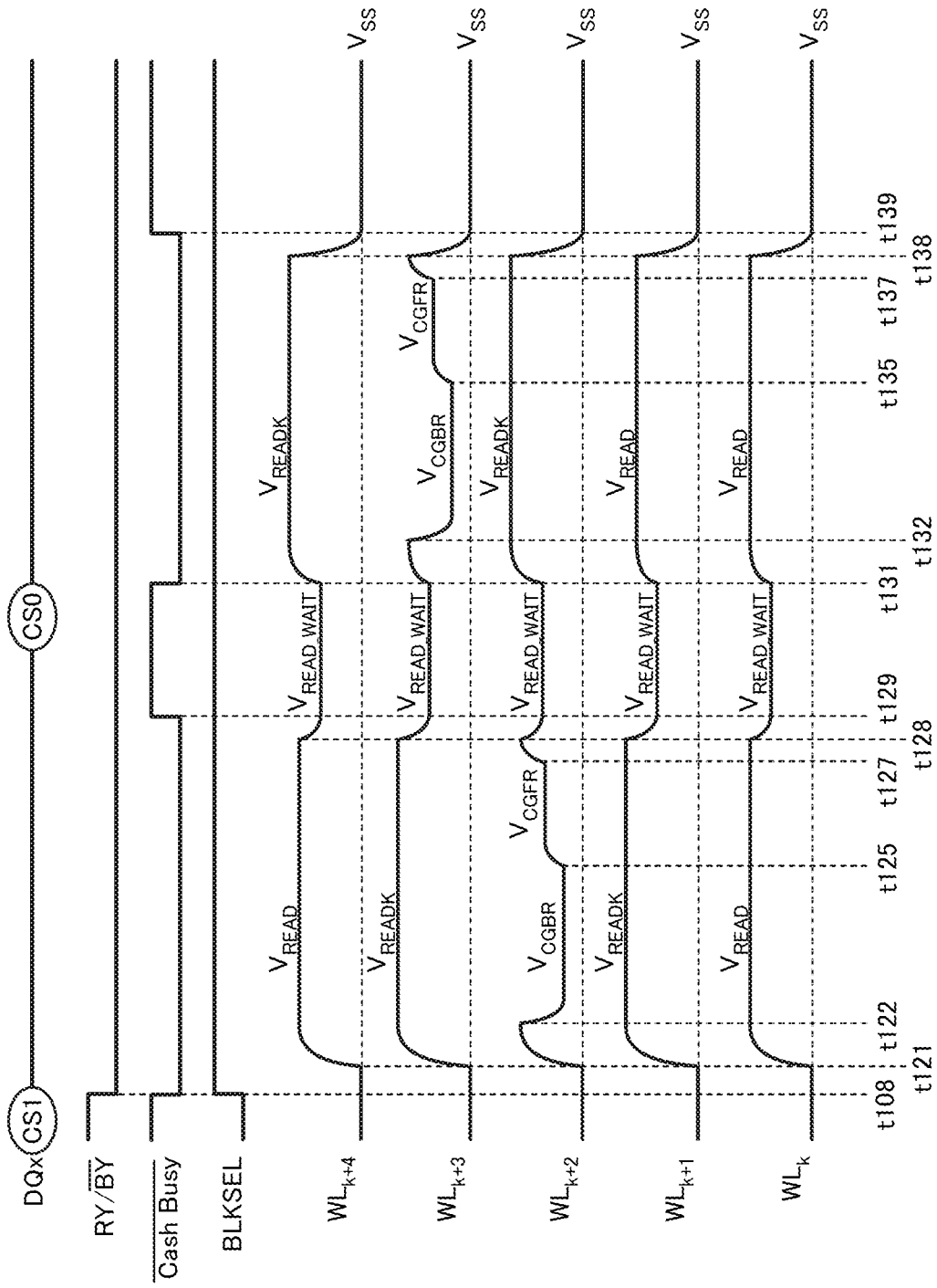
FIG. 20 is a schematic timing chart for describing a read standby mode according to the first embodiment.
Figure 21:
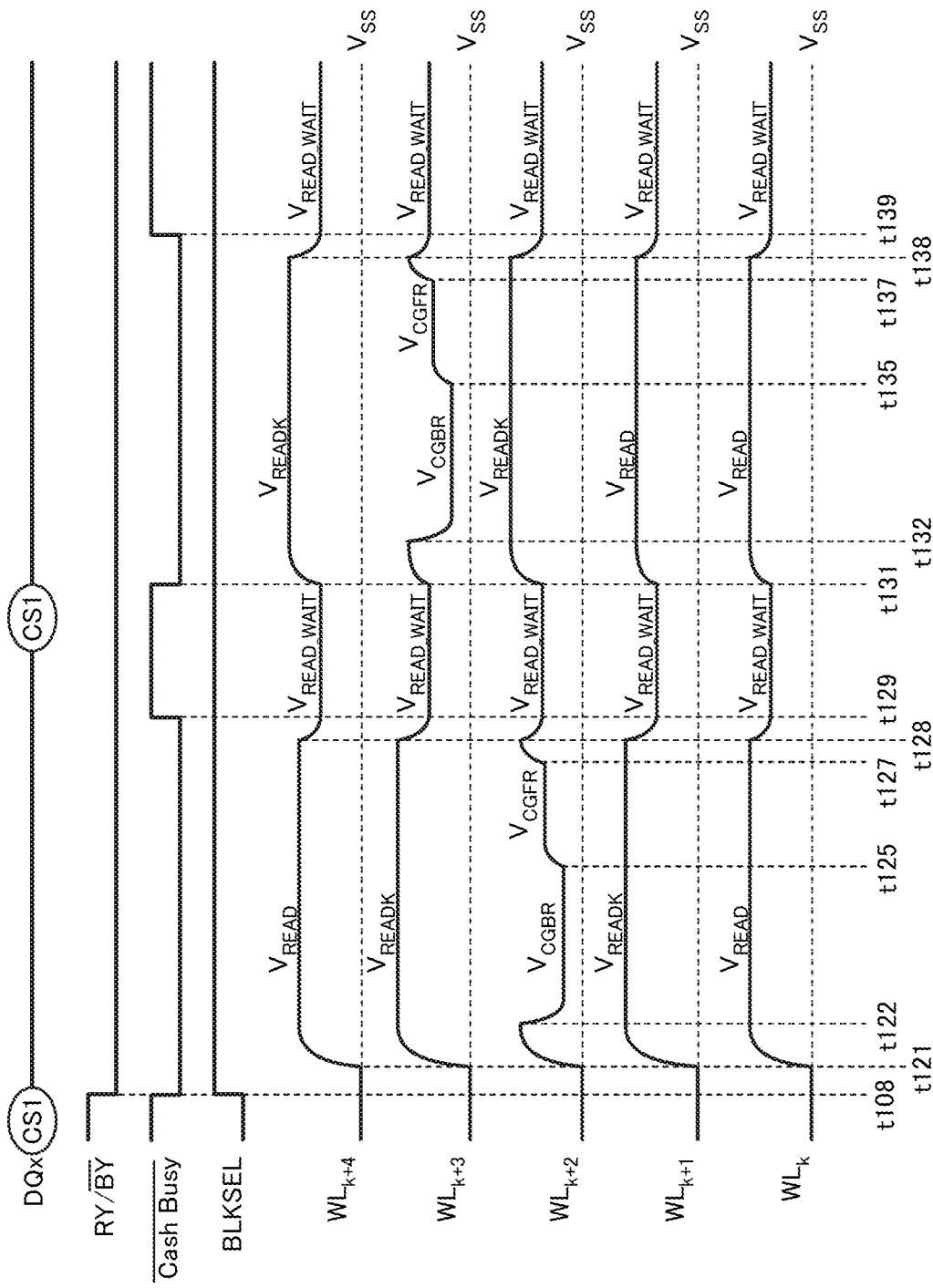
FIG. 21 is a schematic timing chart for describing the read standby mode according to the first embodiment.

Next, the read standby mode according to the embodiment will be described with reference to FIG. 20 and FIG. 21. FIG. 20 and FIG. 21 are schematic timing charts for describing the read standby mode according to the embodiment.

In FIG. 20 and FIG. 21, a word line $WL_k$ to a word line $WL_{k+4}$ are illustrated as the five word lines WL arranged in the Z-direction. In the examples of FIG. 20 and FIG. 21, the read operation is executed on the selected page PG corresponding to the word line $WL_{k+2}$, and subsequently, the read operation is executed on the selected page PG corresponding to the word line $WL_{k+3}$.

The operation from timing t121 to timing t128 in FIG. 20 is executed approximately similarly to the operation from timing t121 to timing t128 in FIG. 19.

However, in the example of FIG. 20, at timing t108, the controller die CD inputs a command set CS1 (FIG. 24) described later, instead of the above-described command set CS0, to the memory die MD. In the example of FIG. 20, at timing t128, instead of the ground voltage $V_{SS}$, the standby voltage $V_{READ\_WAIT}$ is applied to the word line WL. For example, the standby voltage $V_{READ\_WAIT}$ is smaller than the read pass voltage $V_{READ}$ and larger than the ground voltage $V_{SS}$ and the above-described voltage $V_{SRC}$. For example, the standby voltage $V_{READ\_WAIT}$ may be larger than the read voltage $V_{CGGR}$ largest in the read voltage $V_{CGCR}$ to the read voltage $V_{CGGR}$. The semiconductor memory device according to the embodiment is set to the read standby mode at timing t129.

While the illustration is omitted in FIG. 19, at timing t108, a voltage of an internal signal /Cash Busy falls from the "H" state to the "L" state. At timing t129, the voltage of the internal signal /Cash Busy rises from the "L" state to the "H" state. The internal signal /Cash Busy can be read out by status read or the like.

In the read standby mode according to the embodiment, the standby voltage $V_{READ\_WAIT}$ is applied to the word line WL in the memory block BLK as a target of the read operation. Therefore, in the read standby mode according to the embodiment, a plurality of transistors disposed in the current paths between the word lines WL and the voltage generation unit vg2 (FIG. 6) are turned ON. For example, in the read standby mode according to the embodiment, the voltage of the signal line BLKSEL is maintained to the "H" state even when the read operation ends. In the read standby mode according to the embodiment, the voltage of the terminal RY//BY is maintained to the "L" state even when the read operation ends. The voltage of the internal signal /Cash Busy is maintained to the "H" state.

The operation from timing t131 to timing t139 in FIG. 20 is executed approximately similarly to the operation from timing t121 to timing t129.

However, in the example of FIG. 20, from timing t131 to timing t132, the voltage of the word line WL is charged from the standby voltage $V_{READ\_WAIT}$ to the read pass voltage $V_{READ}$, not from the ground voltage $V_{SS}$ to the read pass voltage $V_{READ}$.

In the example of FIG. 20, at timing t138, the word line WL is applied with the ground voltage $V_{SS}$ instead of the standby voltage $V_{READ\_WAIT}$. In the example of FIG. 20, after the execution of the read operation from timing t131 to timing t139, the semiconductor memory device is not set to the read standby mode.

The operation illustrated in FIG. 21 is basically executed similarly to the operation described with reference to FIG. 20.

However, in the example of FIG. 21, at a timing between timing t129 and timing t131, the controller die CD inputs the command set CS1 (FIG. 24) described later, instead of the above-described command set CS0, to the memory die MD. In the example of FIG. 21, at timing t138, instead of the ground voltage $V_{SS}$, the standby voltage $V_{READ\_WAIT}$ is applied to the word line WL. The semiconductor memory device is set to the read standby mode at timing t139.

Here, in the example of FIG. 19, from timing t121 to timing t122 in the read operation, the voltage of the word line WL is charged from the ground voltage $V_{SS}$ to the read pass voltages $V_{READ}$, $V_{READK}$. At timing t127 in the read operation, the ground voltage $V_{SS}$ is applied to the word line WL. Meanwhile, in the examples of FIG. 20 and FIG. 21, at timing t127 in the read operation, the word line WL is applied with not the ground voltage $V_{SS}$ but the standby voltage $V_{READ\_WAIT}$ higher than the ground voltage $V_{SS}$, and this state is maintained even after the end of the read operation. When the next read operation starts, from timing t131 to timing t132, the voltage of the word line WL is charged from the standby voltage $V_{READ\_WAIT}$ to the read pass voltage $V_{READ}$ or the read pass voltage $V_{READK}$.

With this method, when the read operation is executed multiple times to the same memory block BLK, the electric charge amount necessary for charging the word line WL can be reduced. Accordingly, at least one of the operating current and the time necessary for the read operation can be reduced.

Figure 22:
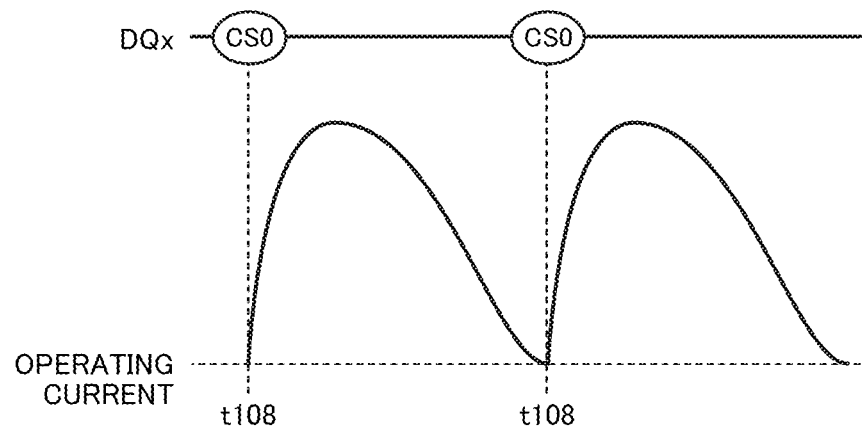
FIG. 22 is a schematic timing chart for describing an operating current of the memory die MD.

For example, when the read operation is executed twice with the method described with reference to FIG. 19, as illustrated in FIG. 22, the magnitudes of the maximum value and the average value of the operating current in the second read operation are similar to the magnitudes of the maximum value and the average value of the operating current in the first read operation.

Figure 23:
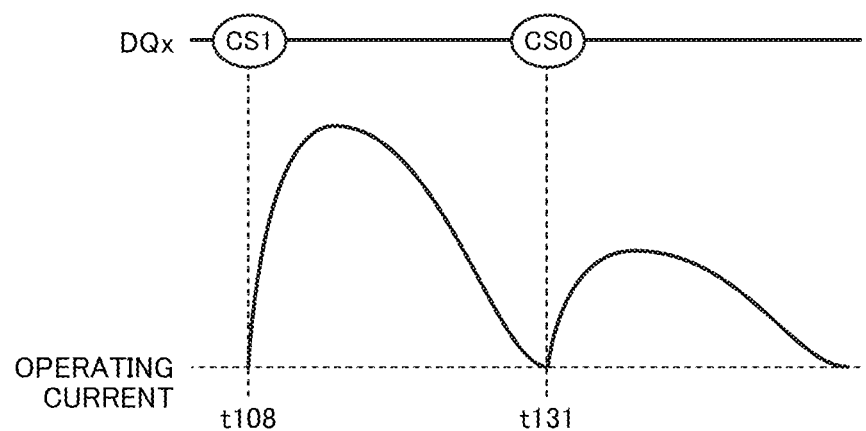
FIG. 23 is a schematic timing chart for describing the operating current of the memory die MD.

Meanwhile, when the read operation is executed twice with the method described with reference to FIG. 20 or FIG. 21, as illustrated in FIG. 23, the maximum value and the average value of the operating current in the second read operation can be decreased to be smaller than the maximum value and the average value of the operating current in the first read operation.

Figure 24:
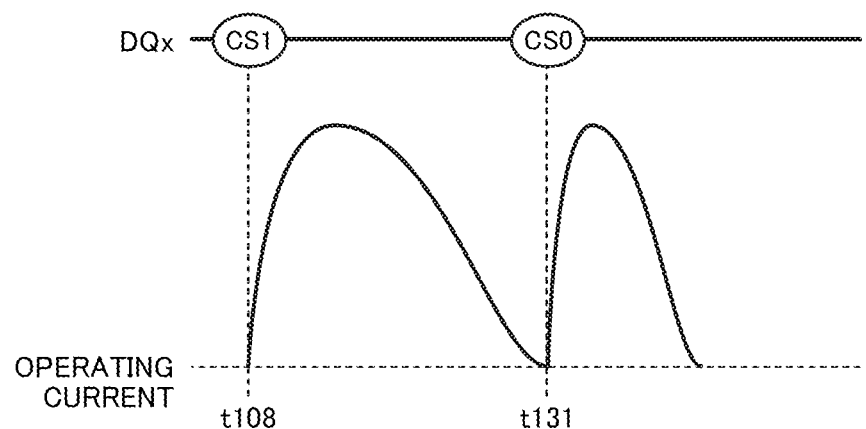
FIG. 24 is a schematic timing chart for describing the operating current of the memory die MD.

Meanwhile, when the read operation is executed twice with the method described with reference to FIG. 20 or FIG. 21, as illustrated in FIG. 24, in a state where the magnitudes of the maximum value and the average value of the operating current in the second read operation are maintained similar to the magnitudes of the maximum value and the average value of the operating current in the first read operation, the time necessary for charging the word line WL can be reduced, thereby allowing the reduction of the time necessary for the read operation.

[Setting of Read Standby Mode]

As a method for setting the semiconductor memory device to the read standby mode, various kinds of methods are considered.

As the method for setting the semiconductor memory device to the read standby mode, for example, a method using the command data $D_{CMD}$ (FIG. 4) is considered.

Figure 25:
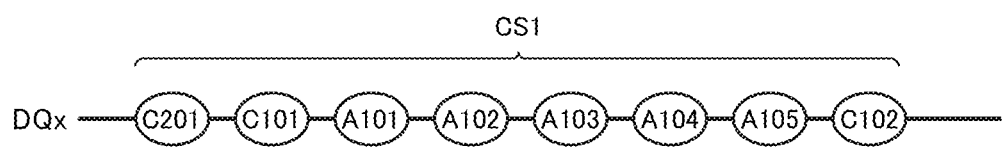
FIG. 25 is a schematic timing chart for describing a setting method for the read standby mode.

As the method using the command data $D_{CMD}$, for example, an adjustment of the command set used in the read operation is considered. For example, as described with reference to FIG. 19, when the semiconductor memory device is not set to the read standby mode after the execution of the read operation, the command set CS0 as described with reference to FIG. 17 may be used. Meanwhile, as the first read operation described with reference to FIG. 20, when the semiconductor memory device is set to the read standby mode after the execution of the read operation, the command set CS1 as described with reference to FIG. 25 may be used. The command set CS1 illustrated in FIG. 25 is basically similar to the command set CS0 illustrated in FIG. 17. However, the command set CS1 illustrated in FIG. 25 includes data C201. In the use of this command set CS1, the controller die CD inputs the data C201 to the memory die MD as the command data $D_{CMD}$. The data C201 is input before the data C101.

Figure 26:
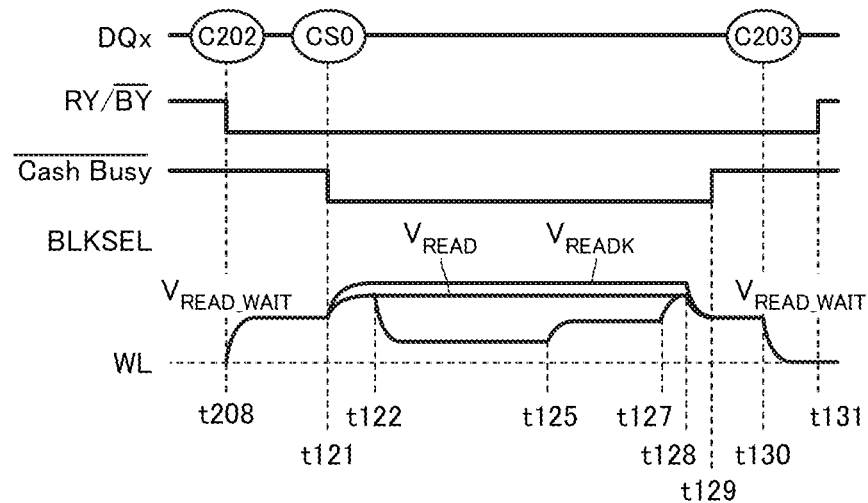
FIG. 26 is a schematic timing chart for describing the setting method for the read standby mode.

As the method using the command data $D_{CMD}$, for example, it is considered to set the memory die MD to which predetermined command data $D_{CMD}$ is input to the read standby mode. For example, in the example of FIG. 26, at timing t208, the controller die CD inputs data C202 to the memory die MD as the command data $D_{CMD}$. In association with this, the memory die MD is set to the read standby mode.

As the method for setting the semiconductor memory device to the read standby mode, for example, a method using a parameter is considered. For example, the memory die MD may be automatically set to the read standby mode after the execution of the read operation when a predetermined parameter is turned to an active state.

As the method for setting the semiconductor memory device to the read standby mode, for example, a method using the pad electrode P is considered. For example, the memory die MD may be set to the read standby mode after the execution of the read operation when the command set CS0 instructing the read operation is input in a state where "H" is input to a predetermined pad electrode P. The memory die MD does not need to be set to the read standby mode after the execution of the read operation when the command set CS0 instructing the read operation is input in a state where "L" is input to this pad electrode P.

[Release of Read Standby Mode]

As a method for releasing the read standby mode of the semiconductor memory device, various kinds of methods are considered.

As the method for releasing the read standby mode of the semiconductor memory device, for example, a method for releasing in response to the execution of the read operation, the write operation, or the erase operation is considered.

For example, as described above, when the semiconductor memory device is set to the read standby mode by adjusting the command set used in the read operation, the read standby mode may be released in response to the execution of the read operation corresponding to the command set CS0 (command set without data C201 of FIG. 25) as described with reference to FIG. 17.

For example, it is also considered to release the read standby mode in response to an input of a command set instructing the execution of the write operation or the erase operation, or the command set CS0, CS1 instructing the execution of the read operation to the other memory blocks BLK.

As the method for releasing the read standby mode of the semiconductor memory device, for example, a method using the command data $D_{CMD}$ is considered. For example, it is considered to release the read standby mode of the memory die MD to which predetermined command data $D_{CMD}$ is input. For example, in the example of FIG. 26, at timing t130, the controller die CD inputs data C203 to the memory die MD as the command data $D_{CMD}$. In association with this, the read standby mode of the memory die MD is released.

As the method for releasing the read standby mode of the semiconductor memory device, for example, a method using a timer is considered. For example, it is considered that when a predetermined time has elapsed after the setting of the memory die MD to the read standby mode, the timer detects it and the read standby mode of the memory die MD is released in accordance with it.

Second Embodiment

Figure 27:
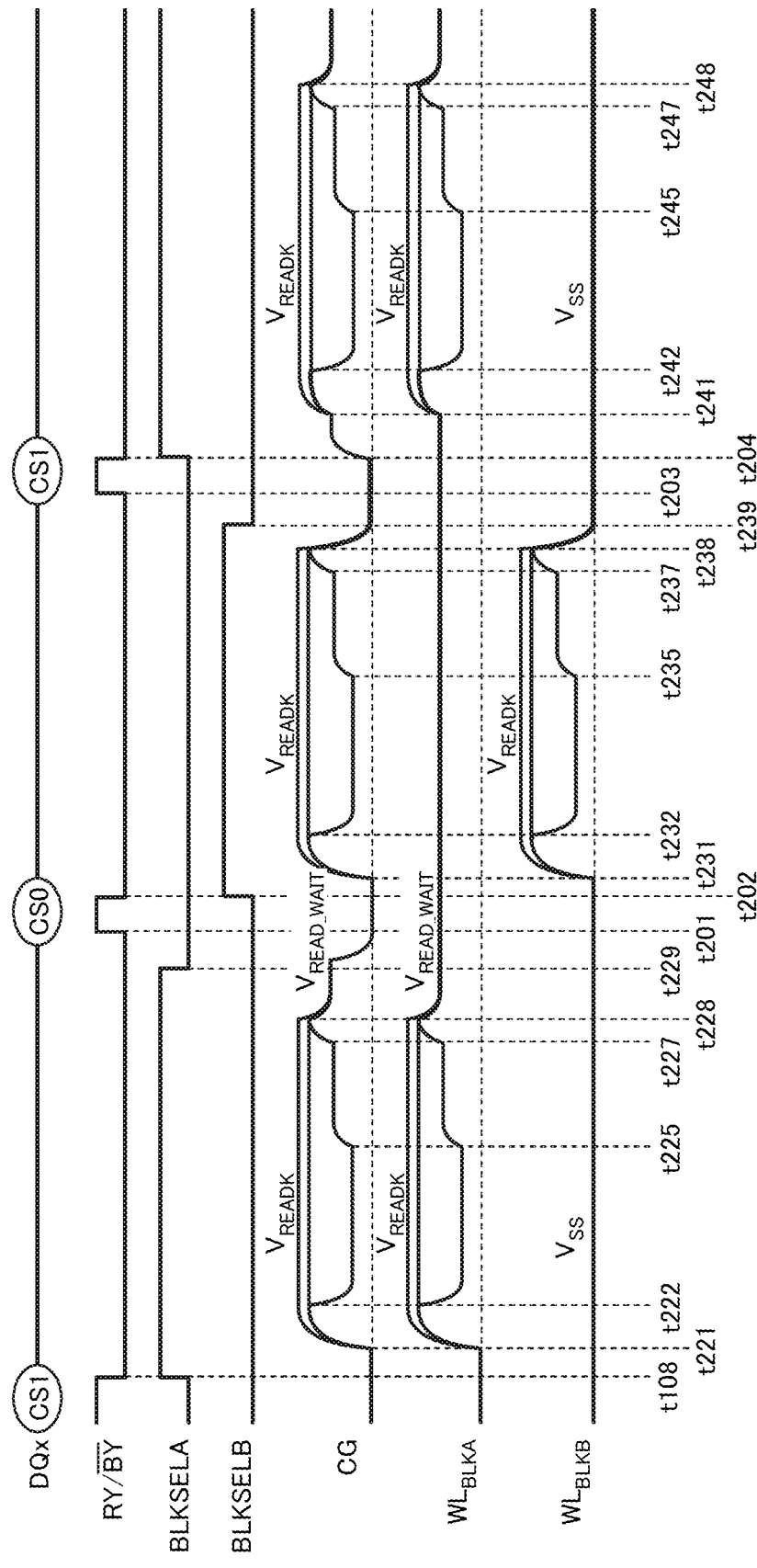
FIG. 27 is a schematic timing chart for describing a read standby mode according to a second embodiment.

Next, with reference to FIG. 27, the read standby mode according to the second embodiment will be described. FIG. 27 is a schematic timing chart for describing the read standby mode according to the second embodiment.

The read standby mode according to the second embodiment is basically similar to the read standby mode according to the first embodiment.

However, in the read standby mode according to the first embodiment, the signal line BLKSEL is maintained to the "H" state. Meanwhile, in the read standby mode according to the second embodiment, the signal line BLKSEL is maintained to the "L" state. Additionally, in the second embodiment, in a case where the semiconductor memory device selects one memory block BLK and transitions to the read standby mode, even when the read operation, the write operation, and the erase operation are executed to the other memory blocks BLK, the read standby mode is maintained during the execution.

For example, FIG. 27 illustrates signal lines BLKSELA, BLKSELB as the two signal lines BLKSEL (FIG. 6) corresponding to the two memory blocks BLK. Word lines $WL_{BLKA}$, $WL_{BLKB}$ are illustrated as a plurality of word lines WL included in the two memory blocks BLK. The wiring CG (FIG. 6) electrically connected to the word lines $WL_{BLKA}$, $WL_{BLKB}$ is illustrated.

From timing t221 to timing t229, the read operation is executed to the memory block BLK corresponding to the signal line BLKSELA. The operation from timing t221 to timing t229 is executed approximately similarly to the operation from timing t121 to timing t129 in FIG. 20.

However, in the example of FIG. 27, at timing t229 (timing at which the read operation ends), the voltage of the signal line BLKSELB falls from the "H" state to the "L" state.

From timing t229 to timing t201, the voltage of the wiring CG falls from the standby voltage $V_{READ\_WAIT}$ to the ground voltage $V_{SS}$. Here, from timing t229 to timing t201, the voltage of the signal line BLKSELA is "L". Therefore, the word line $WL_{BLKA}$ is electrically separated from the wiring CG. Accordingly, the voltage of the word line $WL_{BLKA}$ is maintained to the standby voltage $V_{READ\_WAIT}$. The memory block BLK corresponding to the signal line BLKSELA in the semiconductor memory device according to the embodiment is set to the read standby mode at timing t201.

In the read standby mode according to the embodiment, the word line WL in the memory block BLK as the target of the read operation is electrically separated from the wiring CG in a state of being charged to the standby voltage $V_{READ\_WAIT}$. Therefore, in the read standby mode according to the embodiment, the voltage of the signal line BLKSEL (for example, signal line BLKSELA) is maintained to the "L" state. In the read standby mode according to the embodiment, the voltage of the terminal RY//BY is maintained to the "H" state, and the voltage of the internal signal /Cash Busy (not illustrated) is maintained to the "L" state.

At timing t202, the voltage of the terminal RY//BY falls from the "H" state to the "L" state. The voltage of the signal line BLKSELB rises from the "L" state to the "H" state.

From timing t231 to timing t239, the read operation is executed to the memory block BLK corresponding to the signal line BLKSELB. The operation from timing t231 to timing t239 is executed similarly to the operation from timing t121 to timing t129 in FIG. 19.

At timing t239 (timing at which the read operation ends), the voltage of the signal line BLKSELB falls from the "H" state to the "L" state.

At timing t203, the voltage of the terminal RY//BY rises from the "L" state to the "H" state.

At timing t204, the voltage of the terminal RY//BY falls from the "H" state to the "L" state. The voltage of the signal line BLKSELA rises from the "L" state to the "H" state. In association with this, the wiring CG is charged by the electric charge of the word line $WL_{BLKA}$, and the voltage of the wiring CG increases approximately to the standby voltage $V_{READ\_WAIT}$.

From timing t241 to timing t248, the read operation is executed again to the memory block BLK corresponding to the signal line BLKSELA. The operation from timing t241 to timing t248 is executed approximately similarly to the operation from timing t121 to timing t128 in FIG. 20.

The above-described methods exemplified as the setting method and the release method for the read standby mode according to the first embodiment are basically usable as the setting method and the release method for the read standby mode according to the second embodiment. However, the read standby mode according to the second embodiment does not need to be released, for example, depending on the input of the command set instructing the execution of the read operation, the write operation, or the erase operation to the other memory blocks BLK.

Third Embodiment

Figure 28:
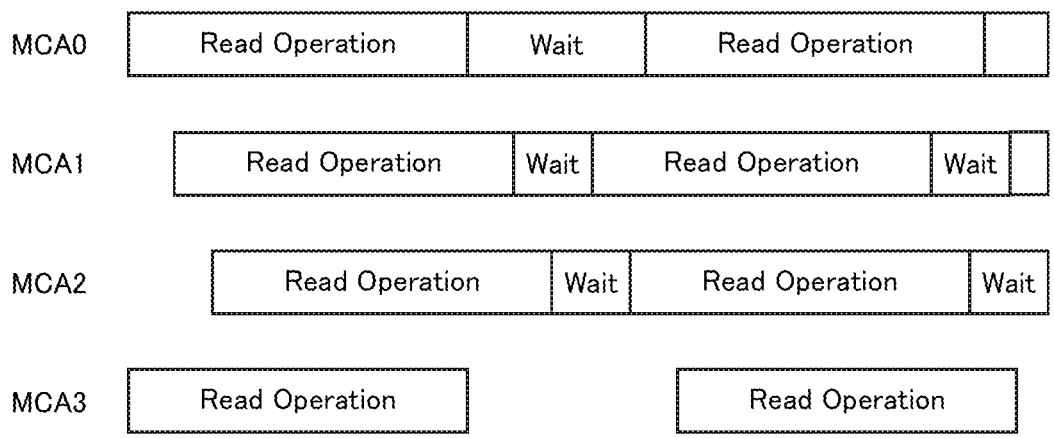
FIG. 28 is a schematic timing chart for describing a read standby mode according to a third embodiment.

Next, with reference to FIG. 28, the read standby mode according to the third embodiment will be described. FIG. 28 is a schematic timing chart for describing the read standby mode according to the third embodiment.

The memory die MD described with reference to FIG. 12 includes the four memory cell arrays MCA corresponding to the four memory cell array regions $R_{MCA}$. The semiconductor memory device according to the third embodiment can execute the read operation simultaneously to a plurality of selected pages PG included in the mutually different memory cell array regions $R_{MCA}$, and can concurrently execute the read operation at independent timings.

FIG. 28 illustrates these four memory cell arrays MCA as memory cell arrays MCA0, MCA1, MCA2, and MCA3.

The semiconductor memory device according to the third embodiment can independently control the setting and the release of the read standby mode to the four memory cell arrays MCA. In the third embodiment, the read standby mode according to the first embodiment may be used, and the read standby mode according to the second embodiment may be used.

For example, in the example of FIG. 28, the memory cell arrays MCA0, MCA1, and MCA2 are set to the read standby mode, and the data is sequentially read out from the three memory blocks BLK corresponding to the memory cell arrays MCA0, MCA1, and MCA2. Meanwhile, the memory cell array MCA3 is not set to the read standby mode, and the read operation as described with reference to FIG. 19 is executed.

Other Embodiments

The semiconductor memory devices according to the first embodiment to the third embodiment have been described above. However, the semiconductor memory devices described above are merely examples, and the operation, the configuration, and the like are adjustable as necessary.

For example, in the semiconductor memory devices according to the first embodiment to the third embodiment, as described with reference to FIG. 16A, FIG. 16B, and FIG. 16C, the memory cells MC each store 3-bit data. However, the data stored in the memory cell MC may be 1-bit, 2-bit, and 4-bit or more.

Here, as described with reference to FIG. 16A, FIG. 16B, FIG. 16C, and the like, when the 3-bit data is stored in the memory cell MC, it is necessary to supply one to four read voltages to the word line WL in the read operation. Meanwhile, for example, when 1-bit data is stored in the memory cell MC, only one read voltage is applied to the word line WL in the read operation. In this aspect, the data can be read out at high speed. However, when the charge and discharge of the word line WL is repeated in every read operation, the amount of the electric charge move per unit time increases, thus possibly increasing the operating current. In this case, when the read standby mode according to the first embodiment or the second embodiment is applied, the operating current can be more effectively reduced.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory string that includes a plurality of memory transistors connected in series;
   a plurality of first wirings connected to gate electrodes of the plurality of memory transistors;
   a plurality of second wirings electrically connected to the plurality of first wirings;
   a plurality of transistors electrically connected between the plurality of first wirings and the plurality of second wirings; and
   a third wiring connected to gate electrodes of the plurality of transistors in common, wherein
   a first read operation is executed in response to an input of a first command set,
   a second read operation is executed in response to an input of a second command set,
   a first voltage that turns the plurality of transistors ON is applied to the third wiring from an end of the first read operation to a start of the second read operation,
   a third voltage is applied to the plurality of second wirings from the end of the first read operation to the start of the second read operation,
   a fourth voltage is applied to the plurality of second wirings after the second read operation ends, and
   the third voltage is larger than the fourth voltage.

2. The semiconductor memory device according to claim 1, wherein
   in the first read operation, a plurality of different read voltages are applied to at least one of the plurality of second wirings, and
   the third voltage is larger than the read voltage largest in the plurality of different read voltages.

3. The semiconductor memory device according to claim 1, wherein
   a fifth voltage is applied to at least one of the plurality of second wirings during execution of the first read operation and the second read operation, and
   the fifth voltage is larger than the third voltage.

4. The semiconductor memory device according to claim 1, wherein
   the first command set includes first address data,
   the second command set includes second address data,
   a part of the first command set excluding the first address data includes first data, and
   a part of the second command set excluding the second address data does not include the first data.

5. The semiconductor memory device according to claim 1, wherein
   the first command set includes first address data,
   the second command set includes second address data, and
   a part of the first command set excluding the first address data matches a part of the second command set excluding the second address data.

6. The semiconductor memory device according to claim 1, further comprising:
   a substrate; and
   a plurality of memory strings, wherein
   the plurality of memory transistors and the plurality of first wirings are arranged in a first direction intersecting with a surface of the substrate, and
   the plurality of memory strings are arranged in a second direction intersecting with the first direction.

7. A semiconductor memory device comprising:
a memory string that includes a plurality of memory transistors connected in series;
a plurality of first wirings connected to gate electrodes of the plurality of memory transistors; and
a plurality of second wirings electrically connected to the plurality of first wirings, wherein
a first read operation is executed in response to an input of a first command set,
a second read operation is executed in response to an input of a second command set,
a first voltage is applied to the plurality of second wirings at a first timing at which the first read operation ends,
a second voltage is applied to the plurality of second wirings at a second timing at which the second read operation ends, and
the first voltage is larger than the second voltage.

8. The semiconductor memory device according to claim 7, wherein
in the first read operation, a plurality of different read voltages are applied to at least one of the plurality of second wirings, and
the first voltage is larger than the read voltage largest in the plurality of different read voltages.

9. The semiconductor memory device according to claim 7, further comprising:
a plurality of transistors electrically connected between the plurality of first wirings and the plurality of second wirings; and
a third wiring connected to gate electrodes of the plurality of transistors in common, wherein
a voltage applied to the third wiring is switched from a third voltage that turns the plurality of transistors ON to a fourth voltage that turns the plurality of transistors OFF at the second timing.

10. The semiconductor memory device according to claim 9, wherein
a voltage applied to the third wiring is maintained to the third voltage at the first timing.

11. The semiconductor memory device according to claim 9, wherein
a voltage applied to the third wiring is switched from the third voltage to the fourth voltage at the first timing.

12. The semiconductor memory device according to claim 7, wherein
a fifth voltage is applied to at least one of the plurality of second wirings during execution of the first read operation and the second read operation, and
the fifth voltage is larger than the first voltage.

13. The semiconductor memory device according to claim 7, wherein
the first command set includes first address data,
the second command set includes second address data,
a part of the first command set excluding the first address data includes first data, and
a part of the second command set excluding the second address data does not include the first data.

14. The semiconductor memory device according to claim 7, wherein
the first command set includes first address data,
the second command set includes second address data, and
a part of the first command set excluding the first address data matches a part of the second command set excluding the second address data.

15. The semiconductor memory device according to claim 7, further comprising:
a substrate; and
a plurality of memory strings, wherein
the plurality of memory transistors and the plurality of first wirings are arranged in a first direction intersecting with a surface of the substrate, and
the plurality of memory strings are arranged in a second direction intersecting with the first direction.

16. A semiconductor memory device comprising:
a memory string that includes a plurality of memory transistors connected in series;
a plurality of first wirings connected to gate electrodes of the plurality of memory transistors;
a plurality of second wirings electrically connected to the plurality of first wirings; and
a first bonding pad electrode to which a first voltage is applied, wherein
a first read operation is executed in response to an input of a first command set,
a second read operation is executed in response to an input of a second command set,
when an execution period of the second read operation in a case where the second read operation is executed after an execution of the first read operation is assumed to be a first period, and an average value of a current flowing to the first bonding pad electrode during the execution of the second read operation is assumed to be a first current,
when an execution period of latter one of the second read operation in a case where the second read operation is executed after an execution of the second read operation is assumed to be a second period, and an average value of a current flowing to the first bonding pad electrode during the execution of the latter one of the second read operation is assumed to be a second current,
the first period is smaller than the second period, or the first current is smaller than the second current,
a second voltage is applied to the plurality of second wirings at a first timing at which the first read operation ends,
a third voltage is applied to the plurality of second wirings at a second timing at which the second read operation ends, and
the second voltage is larger than the third voltage.

17. The semiconductor memory device according to claim 16, further comprising:
a substrate; and
a plurality of memory strings, wherein
the plurality of memory transistors and the plurality of first wirings are arranged in a first direction intersecting with a surface of the substrate, and
the plurality of memory strings are arranged in a second direction intersecting with the first direction.

18. The semiconductor memory device according to claim 7, wherein
the first voltage is executed in response to the input of the first command set when a predetermined parameter is in an active state.

19. The semiconductor memory device according to claim 7, wherein
voltages of the plurality of second wirings are decreased from the first voltage to the second voltage corresponding to a third command set.

20. The semiconductor memory device according to claim 7, further comprising:
a timer, wherein
voltages of the plurality of second wirings are decreased from the first voltage to the second voltage corresponding to a detection of a certain time of the timer.

* * * * *